United States Patent
Lee et al.

(10) Patent No.: US 9,911,689 B2
(45) Date of Patent: Mar. 6, 2018

(54) THROUGH-BODY-VIA ISOLATED COAXIAL CAPACITOR AND TECHNIQUES FOR FORMING SAME

(71) Applicant: INTEL CORPORATION, Santa Clara, CA (US)

(72) Inventors: Kevin J. Lee, Beaverton, OR (US); Ruchir Saraswat, Swindon (GB); Uwe Zillmann, Braunschweig (DE); Nicholas P. Cowley, Wroughton (GB); Andre Schaefer, Sassenburg (DE); Rinkle Jain, Portland, OR (US); Guido Droege, Braunschweig (DE)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/038,623

(22) PCT Filed: Dec. 23, 2013

(86) PCT No.: PCT/US2013/077559
§ 371 (c)(1),
(2) Date: May 23, 2016

(87) PCT Pub. No.: WO2015/099668
PCT Pub. Date: Jul. 2, 2015

(65) Prior Publication Data
US 2017/0040255 A1    Feb. 9, 2017

(51) Int. Cl.
*H01L 21/48* (2006.01)
*H01L 23/522* (2006.01)
(Continued)

(52) U.S. Cl.
CPC ........ *H01L 23/5223* (2013.01); *H01L 21/486* (2013.01); *H01L 21/4846* (2013.01);
(Continued)

(58) Field of Classification Search
CPC ........... H01L 23/5223; H01L 23/49894; H01L 21/4875; H01L 21/8221; H01L 23/492;
(Continued)

(56) References Cited

U.S. PATENT DOCUMENTS

| | | | |
|---|---|---|---|
| 5,814,889 A * | 9/1998 | Gaul | H01L 21/763 257/750 |
| 7,034,401 B2 * | 4/2006 | Savastiouk | H01L 23/147 257/678 |

(Continued)

FOREIGN PATENT DOCUMENTS

| | | |
|---|---|---|
| KR | 100763683 B1 | 9/2007 |
| TW | 201322407 A | 6/2013 |

(Continued)

OTHER PUBLICATIONS

International Preliminary Report on Patentability received for Patent Application No. PCT/US2013/077559. dated Jul. 7, 2016. 10 pages.

(Continued)

*Primary Examiner* — Jarrett Stark
(74) *Attorney, Agent, or Firm* — Finch & Maloney PLLC

(57) ABSTRACT

Techniques are disclosed for forming a through-body-via (TBV) isolated coaxial capacitor in a semiconductor die. In some embodiments, a cylindrical capacitor provided using the disclosed techniques may include, for example, a conductive TBV surrounded by a dielectric material and an outer conductor plate. The TBV and outer plate can be formed, for example, so as to be self-aligned with one another in a coaxial arrangement, in accordance with some embodiments. The disclosed capacitor may extend through the body of a host die such that its terminals are accessible on the upper and/or lower surfaces thereof. Thus, in some cases, the host die can be electrically connected with another die to provide a die stack or other three-dimensional inte- (Continued)

grated circuit (3D IC), in accordance with some embodiments. In some instances, the disclosed capacitor can be utilized, for example, to provide integrated capacitance in a switched-capacitor voltage regulator (SCVR).

7 Claims, 11 Drawing Sheets

(51) Int. Cl.

| | |
|---|---|
| *H01L 21/768* | (2006.01) |
| *H01L 49/02* | (2006.01) |
| *H01L 25/065* | (2006.01) |
| *H01L 23/48* | (2006.01) |
| *H01L 21/822* | (2006.01) |
| *H01L 23/492* | (2006.01) |
| *H01L 23/498* | (2006.01) |
| *H01L 27/06* | (2006.01) |

(52) U.S. Cl.
CPC .... *H01L 21/4875* (2013.01); *H01L 21/76898* (2013.01); *H01L 21/8221* (2013.01); *H01L 23/481* (2013.01); *H01L 23/492* (2013.01); *H01L 23/498* (2013.01); *H01L 23/49827* (2013.01); *H01L 23/49838* (2013.01); *H01L 23/49894* (2013.01); *H01L 25/0657* (2013.01); *H01L 27/0629* (2013.01); *H01L 28/90* (2013.01); *H01L 2225/06544* (2013.01); *H01L 2924/0002* (2013.01)

(58) Field of Classification Search
CPC ........... H01L 27/0629; H01L 23/49827; H01L 23/49838; H01L 21/486; H01L 23/498; H01L 21/4846; H01L 23/481; H01L 25/0657; H01L 21/76898; H01L 28/90
See application file for complete search history.

(56) References Cited

U.S. PATENT DOCUMENTS

| | | | | |
|---|---|---|---|---|
| 7,906,431 B2* | 3/2011 | Mistuhashi | ......... | H01L 21/6835 257/E21.577 |
| 7,964,972 B2 | 6/2011 | Matsui | | |
| 8,202,801 B1* | 6/2012 | Lin | ................... | H01L 21/76898 257/E21.597 |
| 8,519,515 B2* | 8/2013 | Kuo | ................... | H01L 21/76898 257/621 |
| 8,692,381 B1* | 4/2014 | Hart | ................... | H01L 29/66181 257/774 |
| 8,791,550 B1* | 7/2014 | Gu | ....................... | H01L 23/5286 257/621 |
| 8,940,631 B1* | 1/2015 | Sridhar | ................. | H01L 21/486 438/597 |
| 9,070,674 B2* | 6/2015 | Gallegos | ........... | H01L 23/49811 |
| 2002/0017399 A1* | 2/2002 | Chang | ............... | H01L 23/49827 174/262 |
| 2003/0085471 A1 | 5/2003 | Iijima et al. | | |
| 2006/0001174 A1 | 1/2006 | Matsui | | |
| 2007/0161235 A1* | 7/2007 | Trezza | ................ | H01L 21/6835 438/667 |
| 2007/0190692 A1* | 8/2007 | Erturk | ............... | H01L 21/76898 438/118 |
| 2008/0079131 A1* | 4/2008 | Kim | ................... | H01L 21/76898 257/686 |
| 2009/0189256 A1* | 7/2009 | Yoshimura | .......... | H01L 21/6835 257/621 |
| 2010/0140776 A1* | 6/2010 | Trezza | ............. | H01L 21/76898 257/686 |
| 2010/0308435 A1 | 12/2010 | Nowak et al. | | |
| 2011/0084365 A1* | 4/2011 | Law | ........................ | H01L 24/05 257/621 |
| 2011/0095435 A1* | 4/2011 | Volant | ............... | H01L 21/76898 257/774 |
| 2011/0317387 A1 | 12/2011 | Pan et al. | | |
| 2012/0250443 A1 | 10/2012 | Saraswat et al. | | |
| 2014/0070375 A1* | 3/2014 | Grivna | .................. | H01L 23/481 257/621 |

FOREIGN PATENT DOCUMENTS

| | | |
|---|---|---|
| WO | 2013048501 A1 | 4/2013 |
| WO | 2015099668 A1 | 7/2015 |

OTHER PUBLICATIONS

International Search Report and Written Opinion received for Patent Application No. PCT/US2013/077559. dated Sep. 23, 2014. 13 pages.
Taiwan Office Action and Search Report, including English translation of Office Action received for TW Application No. 103139772. dated Dec. 16, 2015, 18 pages.
Extended European Search Report received for EP Application No. 13900035.0, dated Aug. 8, 2017. 9 pages.

\* cited by examiner

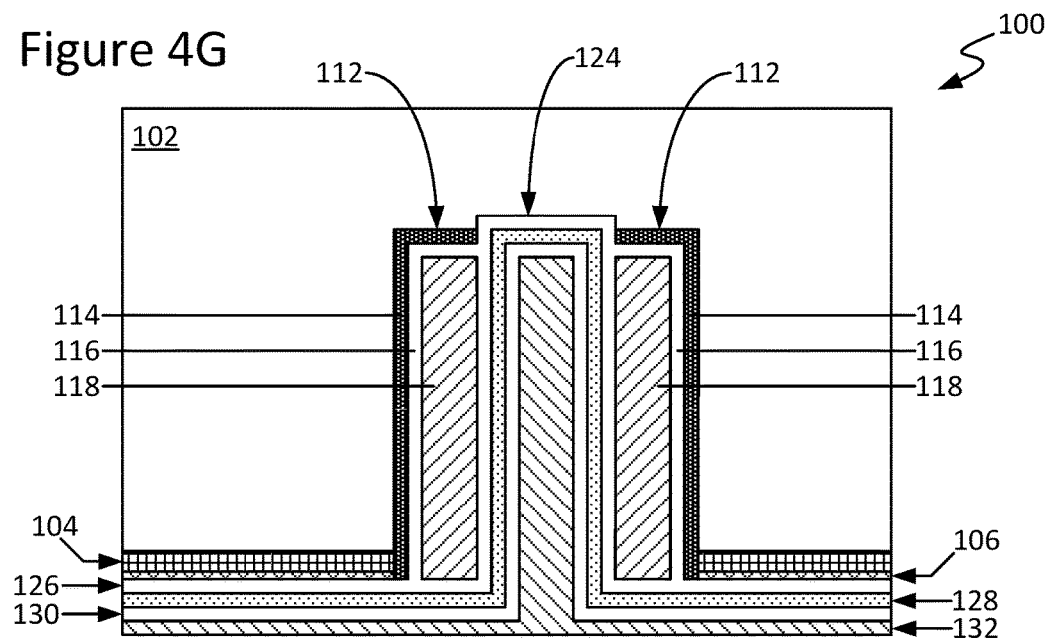
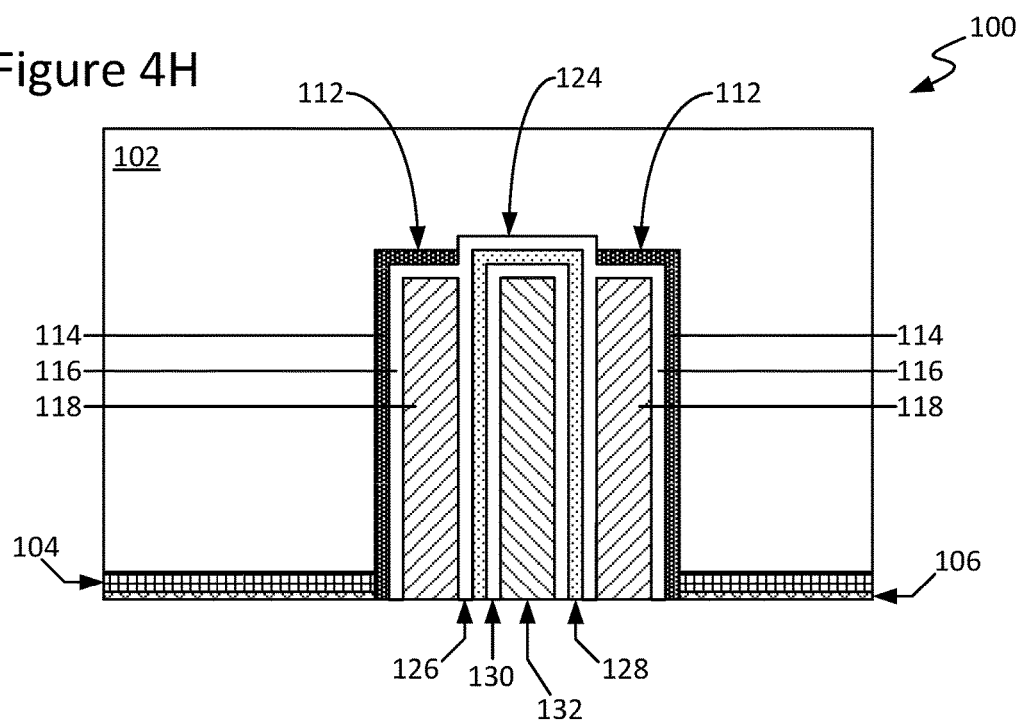

US 9,911,689 B2

THROUGH-BODY-VIA ISOLATED COAXIAL CAPACITOR AND TECHNIQUES FOR FORMING SAME

BACKGROUND

Integrated circuit design in the deep-submicron process nodes (e.g., 32 nm and beyond) involves a number of non-trivial challenges, and three-dimensional integration has faced particular complications with respect to integrated capacitance. Continued process scaling will tend to exacerbate such problems.

BRIEF DESCRIPTION OF THE DRAWINGS

FIG. 4G is a cross-sectional view of the IC of FIG. 4F after removing any remaining patterned resist layer and hardmask layer and after forming a barrier layer, a dielectric layer, a barrier/seed layer, and a metal layer, in accordance with an embodiment of the present disclosure.

FIG. 4H is a cross-sectional view of the IC of FIG. 4G after planarization, in accordance with an embodiment of the present disclosure.

FIG. 4O is a cross-sectional view of the IC of FIG. 4N after de-bonding the carrier substrate, in accordance with an embodiment of the present disclosure.

Figure 1A:
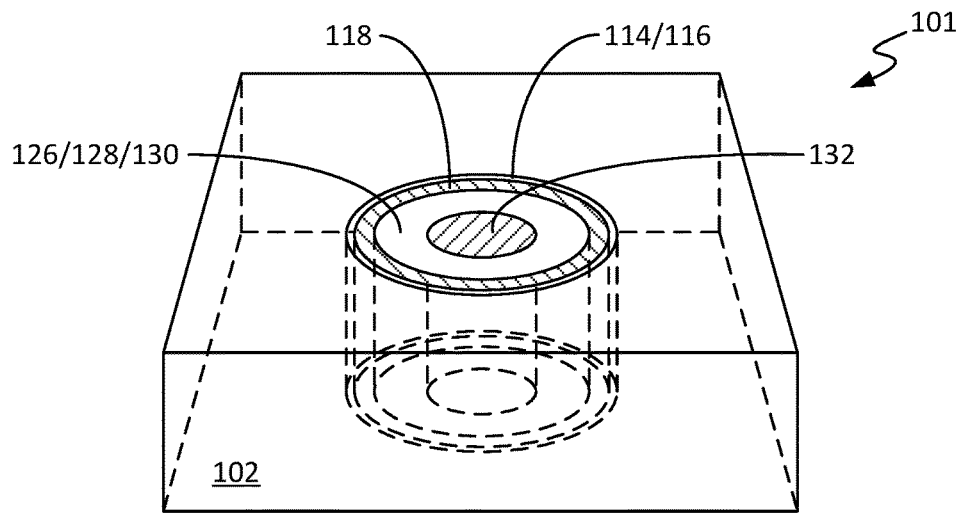
FIGS. 1A-1C illustrate perspective, side cross-sectional, and top views, respectively, of a through-body-via (TBV) isolated coaxial capacitor configured in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines, right angles, etc., and some features may have surface topology or otherwise be non-smooth, given real world limitations of fabrication processes. In short, the figures are provided merely to show example structures.

DETAILED DESCRIPTION

Techniques are disclosed for forming a through-body-via (TBV) isolated coaxial capacitor in a semiconductor die. In some embodiments, a cylindrical capacitor provided using the disclosed techniques may include, for example, a conductive TBV surrounded by a dielectric material and an outer conductor plate. The TBV and outer plate can be formed, for example, so as to be self-aligned with one another in a coaxial arrangement, in accordance with some embodiments. The disclosed capacitor may extend through the body of a host die such that its terminals are accessible on the upper and/or lower surfaces thereof. Thus, in some cases, the host die can be electrically connected with another die to provide a die stack or other three-dimensional integrated circuit (3D IC), in accordance with some embodiments. In some instances, the disclosed capacitor can be utilized, for example, to provide integrated capacitance in a switched-capacitor voltage regulator (SCVR). Numerous other configurations, variations, and applications will be apparent in light of this disclosure.

General Overview

Existing switched-capacitor voltage regulator (SCVR) designs typically utilize metal-insulator-metal (MIM) capacitors to provide integrated capacitance. As a consequence, however, existing SCVRs generally suffer from significant electrical series resistance (ESR). In addition, for these SCVR designs, their MIM capacitors normally are located at the uppermost metal layer within the active metal stack, and thus connection thereof to underlying metallized active circuit elements involves traversing the metal stack.

This adds significant interconnect resistance (e.g., contact resistance), in turn leading to higher losses and limited current density capability of the host SCVR. Furthermore, for a distributed voltage regulator implementation across a given load, existing SCVR designs typically require co-design/routing of the load and the voltage regulator, as well as allocation of metal resources. This adds design challenges, particularly when fine-grained voltage domains are present.

Thus, and in accordance with some embodiments of the present disclosure, techniques are disclosed for forming a through-body-via (TBV) isolated coaxial capacitor in a semiconductor die. In accordance with some embodiments, a capacitor provided using the disclosed techniques may include, for example, an electrically conductive TBV surrounded by a dielectric material (e.g., a high-κ dielectric, a low-κ dielectric, or otherwise) and an outer metal plate (e.g., of relatively low electrical conductivity). Using the disclosed techniques, the TBV and outer plate of the cylindrical capacitor can be formed, for example, so as to be self-aligned with one another in a coaxial arrangement, in accordance with some embodiments. A capacitor configured as described herein may extend through the body of the host die such that its terminals are accessible on the upper and/or lower surfaces thereof. By virtue of this configuration, the host die can be electrically connected with subjacent and/or superjacent dies, for instance, to provide a three-dimensional die stack or other three-dimensional integrated circuit (3D IC), in accordance with some embodiments.

In some cases, a capacitor configured as described herein can be electrically connected, for example, with other circuit components of a host die stack through the one or more redistribution layers (RDLs) thereof. In some other cases, the disclosed capacitor can be electrically connected, for example, using the active metal layer of the host die stack. In some instances, a capacitor configured as described herein can be utilized, for example, to electrically connect the one or more interconnect layers on the active front-side of a first die with the one or more interconnect layers on the active front-side of a second, adjacent die. Numerous suitable configurations will be apparent in light of this disclosure.

In accordance with some embodiments, a capacitor configured as described herein can be utilized, for example, to provide integrated capacitance in a fully integrated switched-capacitor voltage regulator (SCVR) module. That is, in accordance with some embodiments, the MIM capacitors traditionally included in SCVR architectures can be replaced with TBV isolated coaxial capacitors configured as described herein. The suitability of the disclosed TBV isolated coaxial capacitor to this end may be based, at least in part, on any of a variety of factors. For example, the resistance of a single TBV is relatively small (e.g., on the order of milliohms, in some instances) and is reverse proportional to its cross-sectional area. Also, the capacitance of the disclosed capacitor may be controlled, for example, by tuning the permittivity of the dielectric material and/or the diameter/width of the TBV. Furthermore, because the TBV capacitor may be disposed adjacent to the active layer of a die stack, connections can be made to switching transistors without traversing the entire metal stack and vias, thereby leading to a lower resistance in the path. Thus, in some cases, the resultant TBV-based SCVR may exhibit a reduction in ESR as compared to, for example, a typical MIM-based SCVR. Also, as will be appreciated in light of this disclosure, an SCVR including one or more TBV-based capacitors configured as described herein may exhibit a relatively high efficiency at low currents and/or a relatively high density of integrated capacitance, in some cases. Also, some embodiments may eliminate or otherwise reduce the aforementioned intrusiveness issues typically associated with the use of MIM capacitors in a distributed SCVR architecture.

It should be noted, however, that the present disclosure is not so limited to implementation of a TBV isolated coaxial capacitor only within a SCVR module. For example, in accordance with some embodiments, a capacitor provided using the disclosed techniques can be utilized as a decoupling capacitor for filtering out noise in a power grid (and/or related applications). In accordance with some embodiments, a capacitor configured as described herein may be used, for example, in a LC circuit (e.g., resonant or tank circuit), a filter, and/or any other circuit application that may utilize on-die capacitance. Other suitable applications for a TBV isolated coaxial capacitor configured as described herein will be apparent in light of this disclosure.

Some embodiments may be configured to be connected, for example, to active circuit elements, which in turn may help to reduce contact resistance, and thus reduce ESR. Some embodiments may realize a savings in die area, for example, which in turn may help to reduce cost. Also, in accordance with some embodiments, use of the disclosed techniques may be detected, for example, by visual or other inspection (e.g., cross-sectional scanning electron microscopy, or SEM; etc.) of a given integrated circuit or other device having a through-body-via (TBV) isolated coaxial capacitor configured as described herein. In some cases, use of the disclosed techniques may be detected, for example, upon observing a 3D die stack including a fully integrated SCVR without a MIM capacitor or otherwise having a high capacitor density.

Structure

Figure 1B:
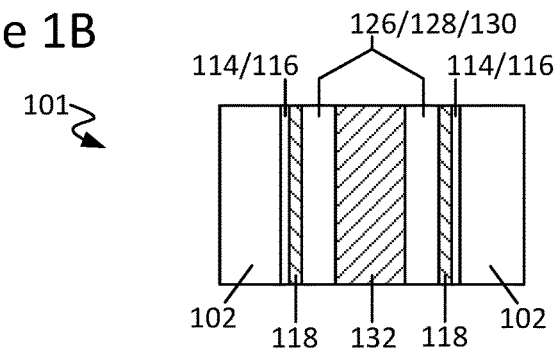
Figure 1C:
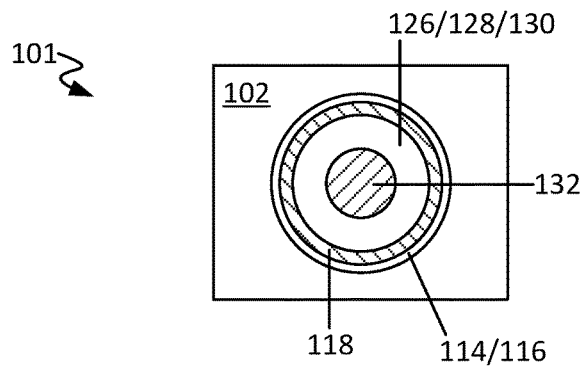

FIGS. 1A-1C illustrate several views of a through-body-via (TBV) isolated coaxial capacitor 101, configured in accordance with an embodiment of the present disclosure. As discussed herein, capacitor 101 may include an outer conductor plate 118, a dielectric layer 128 disposed within an interior region bounded by outer conductor plate 118, and an inner conductor plate 132 (e.g., a TBV) formed within an interior region bounded by dielectric layer 128, in accordance with some embodiments. As can be seen, outer conductor plate 118 and inner conductor plate 132 can be arranged coaxially with one another, thereby providing a cylindrical capacitor, in accordance with some embodiments. One or more additional layers, such as an insulator layer 114, a barrier/seed layer 116, a barrier layer 126, and/or a barrier/seed layer 130 (each described herein) may be included in and/or around the structure of capacitor 101, in accordance with some embodiments. Also, as discussed herein, capacitor 101 can be provided with any of a wide variety of electrical connections, as desired. Numerous configurations will be apparent in light of this disclosure.

Figure 2:
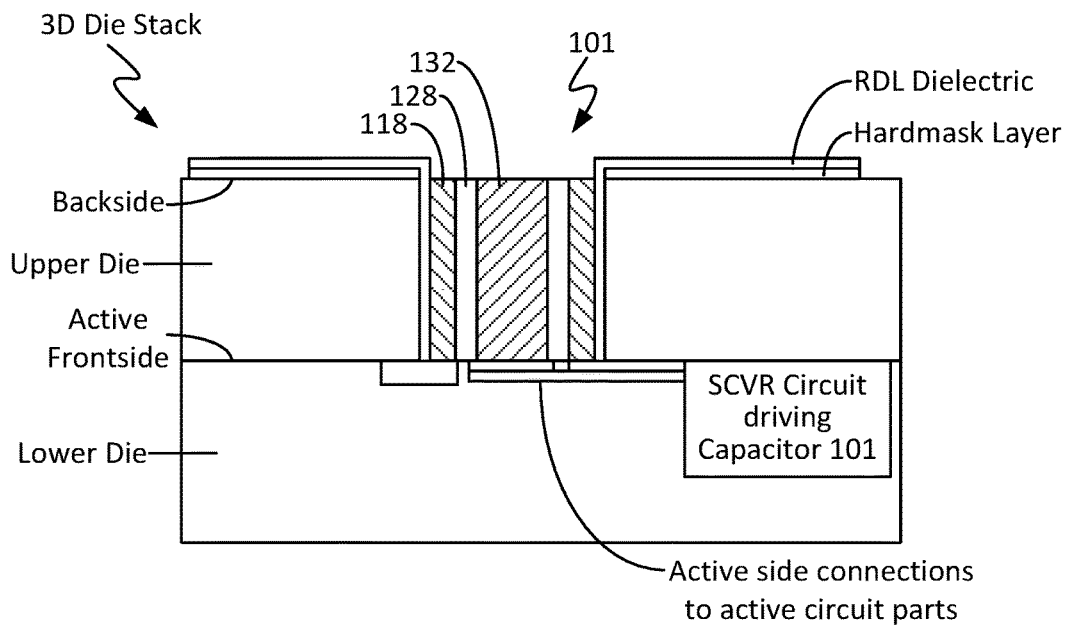
FIG. 2 illustrates a side cross-sectional view of a three-dimensional (3D) die stack including a TBV isolated coaxial capacitor configured in accordance with an embodiment of the present disclosure.

In accordance with some embodiments, a capacitor 101 configured as described herein can be electrically connected with upper and/or lower circuit dies (e.g., in a 3D die stack), as desired for a given target application or end-use. For example, in accordance with some embodiments, a capacitor 101 can be provided with connections through one or more redistribution layers (RDLs) of a 3D die stack. In accordance with some other embodiments, a capacitor 101 can be connected using the active metal layer of a 3D die stack. To that end, a coaxial bottom plate structure may be formed, for example, during fabrication of the active side die. For instance, consider FIG. 2, which illustrates a 3D die stack including a TBV isolated coaxial capacitor 101, configured in accordance with an embodiment of the present disclosure. As can be seen, capacitor 101 can be provided with active side connections, for example, to active circuit parts of a lower die. As will be appreciated in light of this disclosure, such a configuration may help to reduce interconnect resistance, in some cases.

Figure 3:
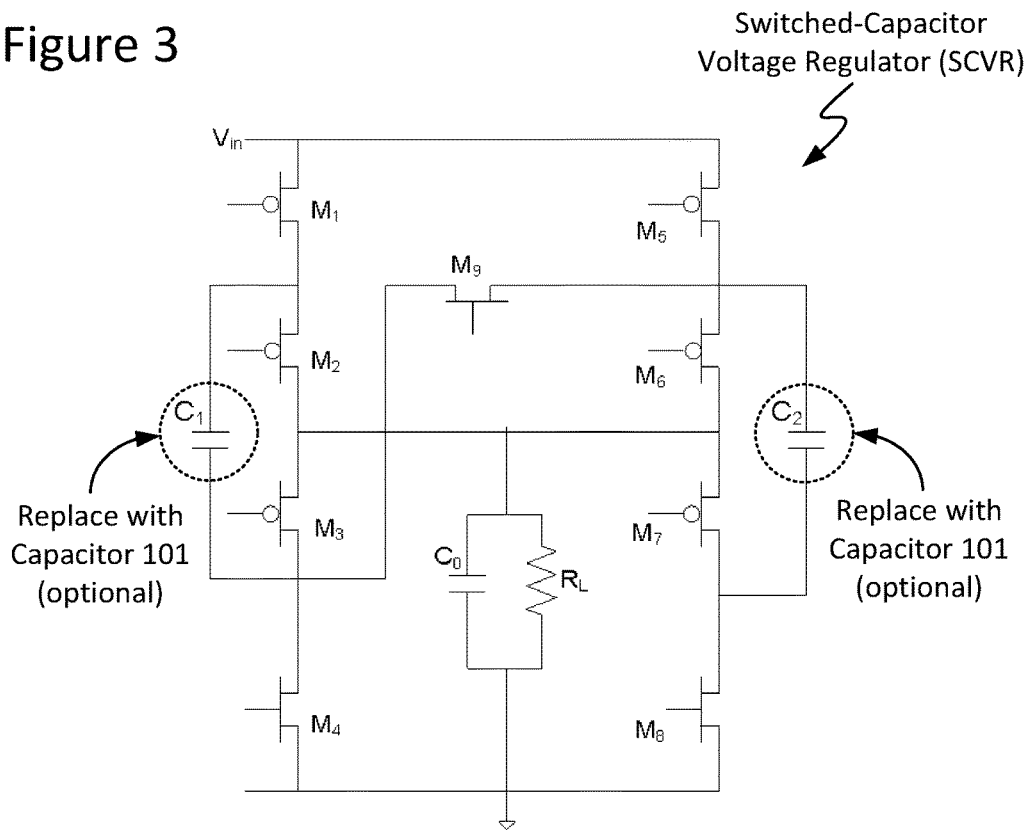
FIG. 3 is a circuit diagram of an example switched-capacitor voltage regulator (SCVR), which may utilize one or more TBV isolated coaxial capacitors, in accordance with an embodiment of the present disclosure.

As will be further appreciated in light of this disclosure, a capacitor 101 configured as described herein can have any of a wide range of applications. For instance, in some embodiments, a capacitor 101 can be utilized in a switched-capacitor voltage regulator (SCVR). For example, consider FIG. 3, which is a circuit diagram of an example SCVR architecture that may utilize one or more TBV isolated coaxial capacitors 101, in accordance with an embodiment of the present disclosure. As previously discussed, existing on-die SCVRs typically employ metal-insulator-metal (MIM) capacitors. Thus, within the example context of the SCVR of FIG. 3, existing architectures would employ MIM capacitors at circuit elements $C_1$ and $C_2$. However, as previously discussed, existing SCVR architectures normally include their MIM capacitors at the uppermost metal layer within the active metal stack. In turn, this type of configuration causes existing SCVRs to have high interconnect resistance (e.g., contact resistance), and thus higher losses and limited current density capability. Thus, and in accordance with some embodiments, one or both of the capacitors $C_1$ and $C_2$ of the SCVR of FIG. 3 optionally may be replaced with a capacitor 101 configured as described herein. As a result of optionally implementing coaxial capacitors 101 for capacitor elements $C_1$ and/or $C_2$ of the SCVR of FIG. 3, an improvement in ESR as compared to, for example, a typical MIM-based SCVR may be realized, in some embodiments.

Methodology

Figure 4A:
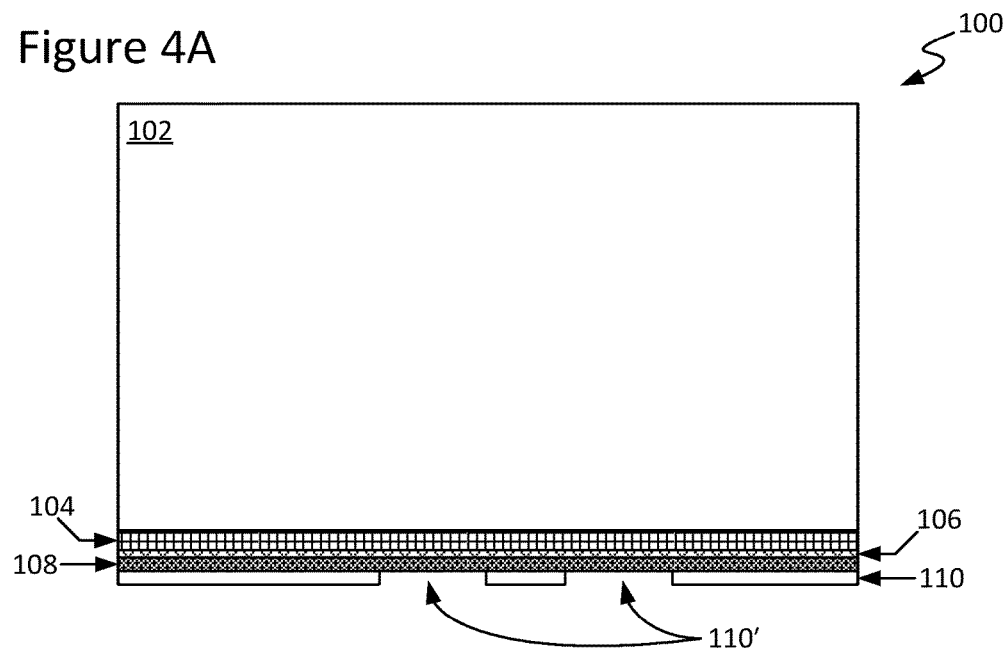
FIG. 4A is a cross-sectional view of an integrated circuit (IC), in accordance with an embodiment of the present disclosure.

FIGS. 4A-4O illustrate an integrated circuit (IC) fabrication process flow, in accordance with an embodiment of the present disclosure. As discussed herein, the disclosed techniques can be used, in accordance with some embodiments, to provide an IC 100 including one or more through-body-via (TBV) isolated coaxial capacitors 101. As will be appreciated in light of this disclosure, the disclosed process flow can be considered, in a general sense, a via-middle (e.g., as opposed to a via-first or a via-last) process flow for forming a TBV isolated coaxial capacitor 101.

The process may begin as in FIG. 4A, which is a cross-sectional view of an integrated circuit (IC) 100, in accordance with an embodiment of the present disclosure. As can be seen, IC 100 initially may include a semiconductor layer 102. Semiconductor layer 102 can be formed from any suitable semiconductor material (or combination of such materials), such as silicon (Si) and/or silicon germanium (SiGe). Semiconductor layer 102 can have any of a wide range of configurations, including, for example: a bulk semiconductor substrate; a silicon-on-insulator (SOI) structure; a semiconductor wafer; and/or a multi-layered structure. Furthermore, the dimensions of semiconductor layer 102 can be customized for a given target application or end-use. As will be appreciated in light of this disclosure, it may be desirable to ensure that semiconductor layer 102 is of sufficient thickness, for example, to permit formation of one or more through-body-via (TBV) isolated coaxial capacitors 101 (discussed herein), which are of sufficient dimensions for a given target application or end-use. Other suitable materials, configurations, and dimensions for semiconductor layer 102 will depend on a given application and will be apparent in light of this disclosure.

Also, as can be seen, IC 100 initially may include one or more front-end transistor layers 104 formed over semiconductor layer 102. Together, semiconductor layer 102 and the one or more front-end layers 104 may provide, in some cases, a partially completed device wafer that is available for downstream use and/or further processing. For example, in accordance with some embodiments, semiconductor layer 102 and front-end layer(s) 104 may provide a structure upon which an additional layer and/or component can be populated.

As can be seen further from FIG. 4A, a polish stop layer 106 can be formed over the surface of IC 100 (e.g., over the one or more front-end layers 104). Polish stop layer 106 can be formed from any suitable polish stop material (or combination of such materials). For example, in some cases, polish stop layer 106 may be formed from: silicon nitride ($Si_3N_4$); silicon carbide (SiC); and/or a combination of any thereof. In some cases, it may be desirable to select a polish stop layer 106 that has sufficient selectivity, for example, to chemical-mechanical planarization (CMP) slurries (or other planarization/polishing processes) which may be utilized in the disclosed process flow. Other suitable materials for polish stop layer 106 will depend on a given application and will be apparent in light of this disclosure.

As will be appreciated in light of this disclosure, polish stop layer 106 can be formed over IC 100 using any technique, as typically done. In accordance with some example embodiments, polish stop layer 106 may be formed using a chemical vapor deposition (CVD) process, such as plasma-enhanced CVD (PECVD). Other suitable techniques for forming polish stop layer 106 will depend on a given application and will be apparent in light of this disclosure.

Furthermore, the dimensions of polish stop layer 106 can be customized as desired for a given target application or end-use. For example, in some embodiments, polish stop layer 106 may have a thickness in the range of about 30-3,000 nm (e.g., about 30-1,000 nm, about 1,000-2,000 nm, about 2,000-3,000 nm, or any other sub-range in the range of about 0.1-1.0 µm). In some instances, polish stop layer 106 may have a substantially uniform thickness over the topography provided, for example, by any underlying layers of IC 100 (e.g., the one or more front-end layers 104). In some instances, polish stop layer 106 may be provided as a substantially conformal layer over such topography. In some other instances, polish stop layer 106 may be provided with a non-uniform or otherwise varying thickness over such topography. For example, in some cases a first portion of polish stop layer 106 may have a thickness within a first range while a second portion thereof has a thickness within a second, different range. Other suitable dimensions for polish stop layer 106 will depend on a given application and will be apparent in light of this disclosure.

Additionally, as can be seen from FIG. 4A, a hardmask layer 108 can be formed over the surface of IC 100 (e.g., over polish stop layer 106). Hardmask layer 108 can be formed from any suitable hardmask material (or combination of such materials). For example, in some cases, hardmask layer 108 may be formed from: silicon dioxide ($SiO_2$); silicon nitride ($Si_3N_4$); silicon oxynitride ($SiO_xN_y$); and/or a combination of any one or more thereof. Other suitable materials for hardmask layer 108 will depend on a given application and will be apparent in light of this disclosure.

Hardmask layer 108 can be formed over IC 100 using any of a wide variety of techniques. For example, in accordance with some embodiments, hardmask layer 108 may be formed using: a chemical vapor deposition (CVD) process; a spin-on deposition (SOD) process; and/or a combination of any one or more thereof. Other suitable techniques for forming hardmask layer 108 will depend on a given application and will be apparent in light of this disclosure.

Furthermore, the dimensions of hardmask layer 108 can be customized as desired for a given target application or end-use. For example, in some embodiments, hardmask layer 108 may have a thickness in the range of about 1.0-5.0 µm (e.g., about 1.0-2.5 µm, about 2.5-5.0 µm, or any other sub-range in the range of about 1.0-5.0 µm). In some instances, the thickness of hardmask layer 108 may be selected, at least in part, based on the desired depth of the one or more openings 112 (discussed below) to be etched into IC 100. In some instances, hardmask layer 108 may have a substantially uniform thickness over the topography provided, for example, by any underlying layers of IC 100 (e.g., polish stop layer 106). In some instances, hardmask layer 108 may be provided as a substantially conformal layer over such topography. In some other instances, hardmask layer 108 may be provided with a non-uniform or otherwise varying thickness over such topography. For example, in some cases a first portion of hardmask layer 108 may have a thickness within a first range while a second portion thereof has a thickness within a second, different range. Other suitable dimensions for hardmask layer 108 will depend on a given application and will be apparent in light of this disclosure.

As can be seen further from FIG. 4A, a resist layer 110 may be formed over the surface of IC 100 (e.g., over hardmask layer 108). As will be appreciated in light of this disclosure, resist layer 110 can be formed from any suitable resist material (or combination of such materials) and using any suitable technique (or combination of techniques), as typically done. For example, in some cases, a spin-on deposition (SOD) process may be utilized to distribute a liquid photoresist over IC 100. In some other cases, a laminated dry film photoresist may be deposited over IC 100. As will be appreciated further, after deposition, resist layer 110 can undergo additional processing (e.g., exposure and development), as typically done. Other suitable materials and techniques for forming resist layer 110 will depend on a given application and will be apparent in light of this disclosure.

Furthermore, the dimensions of resist layer 110 can be customized as desired for a given target application or end-use. For example, in some embodiments, resist layer 110 may have a thickness in the range of about 0.3-5.0 µm (e.g., about 0.3-2.5 µm, about 2.5-5.0 µm, or any other sub-range in the range of about 0.3-5.0 µm). In some instances, resist layer 110 may have a substantially uniform thickness over the topography provided, for example, by any underlying layers of IC 100 (e.g., hardmask layer 108). In some instances, resist layer 110 may be provided as a substantially conformal layer over such topography. In some other instances, resist layer 110 may be provided with a non-uniform or otherwise varying thickness over such topography. For example, in some cases a first portion of resist layer 110 may have a thickness within a first range while a second portion thereof has a thickness within a second, different range. Other suitable dimensions for resist layer 110 will depend on a given application and will be apparent in light of this disclosure.

In accordance with some embodiments, resist layer 110 may be processed so as to form one or more openings 110' therein. In accordance with some embodiments, the openings 110' may be formed over a region of IC 100 in which the outer plate opening 112 (discussed below) is to be formed. The dimensions of a given opening 110' of resist layer 110 can be customized as desired for a given target application or end-use. A given opening 110' may be provided with a depth, for example, that traverses the entire thickness of resist layer 110, thus exposing the surface of underlying hardmask layer 108, in some cases. Also, as will be appreciated in light of this disclosure, the width of a given opening 110' may determine, at least in part, the thickness ($T_O$) of the outer plate opening 112 (discussed below) that may be formed there under. Other suitable dimensions for the one or more openings 110' will depend on a given application and will be apparent in light of this disclosure.

Figure 4B:
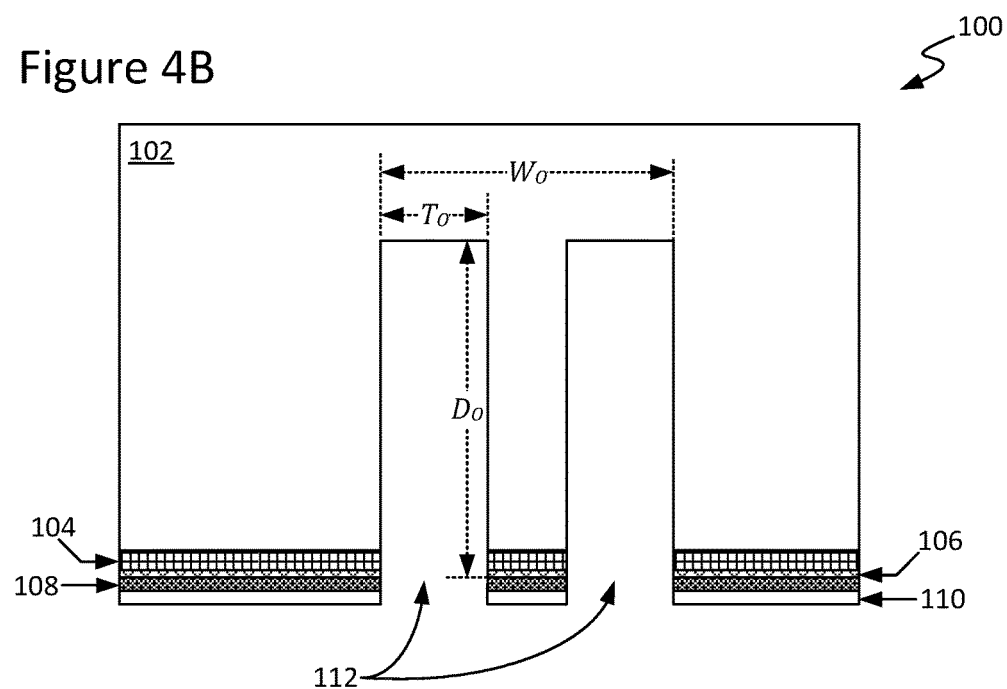
FIG. 4B is a cross-sectional view of the IC of FIG. 4A after forming an outer plate opening therein, in accordance with an embodiment of the present disclosure.

The process may continue as in FIG. 4B, which is a cross-sectional view of the IC 100 of FIG. 4A after forming an outer plate opening 112 therein, in accordance with an embodiment of the present disclosure. Outer plate opening 112 may be formed in IC 100, in accordance with some embodiments, by utilizing patterned resist layer 110 (e.g., patterned with one or more openings 110') as a mask and etching through hardmask layer 108, polish stop layer 106, and/or the one or more front-end layers 104, and into semiconductor layer 102. To that end, outer plate opening 112 may be formed, in accordance with some embodiments, using an anisotropic dry plasma etching process. The etch chemistry can be customized, as desired, and in some instances may be one, for example, that can be utilized in pulsed or time-multiplexed (e.g., Bosch process) etching. Other suitable techniques for forming outer plate opening 112 will depend on a given application and will be apparent in light of this disclosure.

As discussed herein, outer plate opening 112 may be configured, in accordance with some embodiments, to host, at least in part: (1) an insulator layer 114; (2) a barrier layer 116; and/or (3) the outer conductor plate 118 of capacitor 101. To that end, the geometry and/or dimensions of outer plate opening 112 can be customized as desired for a given target application or end-use, in accordance with some embodiments. For instance, in some cases, outer plate opening 112 may have a generally tubular geometry that may be generally annular in cross-sectional profile. In some embodiments, outer plate opening 112 may have a depth ($D_O$), for example, in the range of about 50-100 µm (e.g., about 50-75 µm, about 75-100 µm, or any other sub-range in the range of about 50-100 µm). In some embodiments, outer plate opening 112 may have a thickness ($T_O$), for example, in the range of about 2-10 µm (e.g., about 2-6 µm, about 6-10 µm, or any other sub-range in the range of about 2-10 µm). In some embodiments, outer plate opening 112 may have a width ($W_O$), for example, in the range of about 6-30 µm (e.g., about 6-18 µm, about 18-30 µm, or any other sub-range in the range of about 6-30 µm). Other suitable geometries and dimensions for outer plate opening 112 will depend on a given application and will be apparent in light of this disclosure.

Figure 4C:
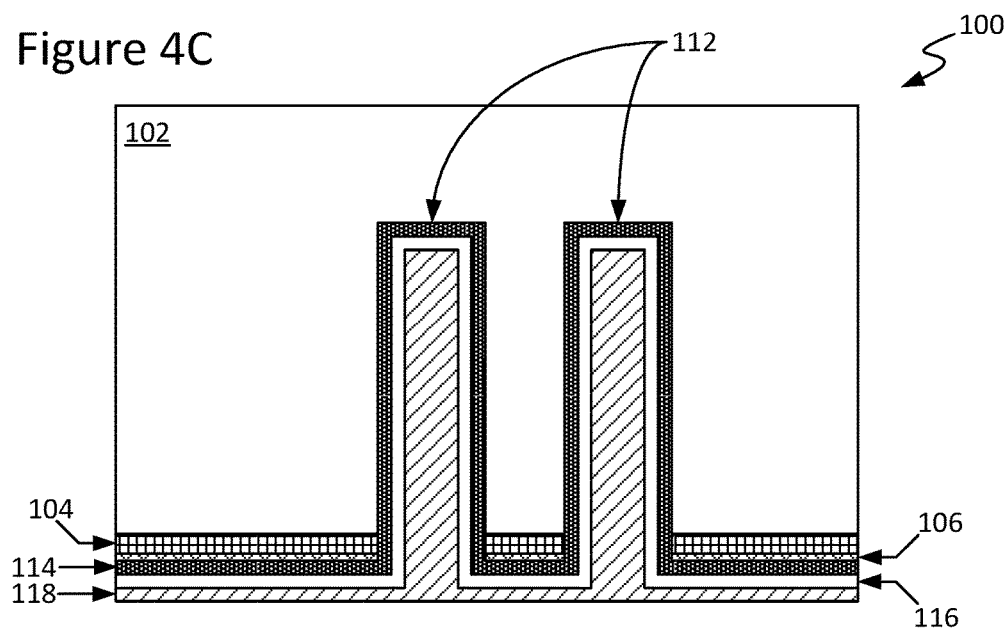
FIG. 4C is a cross-sectional view of the IC of FIG. 4B after removing any remaining patterned resist layer and hardmask layer and after forming an insulator layer, a barrier/seed layer, and a metal layer, in accordance with an embodiment of the present disclosure.

The process may continue as in FIG. 4C, which is a cross-sectional view of the IC 100 of FIG. 4B after removing any remaining patterned resist layer 110 and hardmask layer 108 and after forming an insulator layer 114, a barrier/seed layer 116, and a metal layer 118, in accordance with an embodiment of the present disclosure. As can be seen, any remaining resist layer 110 and hardmask layer 108 can be removed from IC 100. It should be noted, however, that in some cases, the etch time for forming outer plate opening 112 may be sufficiently lengthy, for example, such that resist layer 110 may be etched away, in part or in whole, during such etch processing. Also, in some cases, there may be one or more additional cleans, for example, to remove any etch polymer that may have formed during the etch processing of insulator layer 102 to form outer plate opening 112. Other suitable techniques for removing the remainder, if any, of resist layer 110 and/or hardmask layer 108 will depend on a given application and will be apparent in light of this disclosure.

As can be seen from FIG. 4C, an insulator layer 114 may be formed over the surface of IC 100 (e.g., over the topography provided by polish stop layer 106, the one or more front-end layers 104, semiconductor layer 102, and/or a given outer plate opening 112). Insulator layer 114 can be formed from any suitable insulator material (or combination of such materials). For example, in some cases, insulator layer 114 may be formed from: silicon dioxide ($SiO_2$); a polymer, such as polyimide; and/or a combination of any one or more thereof. Other suitable materials for insulator layer 114 will depend on a given application and will be apparent in light of this disclosure.

Also, insulator layer 114 can be formed over IC 100 using any of a wide variety of techniques. For example, in accordance with some embodiments, insulator layer 114 may be formed using a chemical vapor deposition (CVD) process, such as plasma-enhanced CVD (PECVD). Other suitable techniques for forming insulator layer 114 will depend on a given application and will be apparent in light of this disclosure.

Furthermore, the dimensions of insulator layer 114 can be customized as desired for a given target application or end-use. For example, in some cases, a sufficient amount of insulator layer 114 may be deposited over IC 100 so as to ensure that a portion thereof within outer plate opening 112 has a thickness in the range of about 100-400 nm (e.g., about 150-250 nm, about 250-350 nm, or any other sub-range in the range of about 100-400 nm). In some embodiments, insulator layer 114 may be formed over IC 100, at least in part, so as to line the bottom and sidewalls of a given outer plate opening 112. In some instances, insulator layer 114 may have a substantially uniform thickness over the topography provided, for example, by any underlying layers of IC 100 (e.g., polish stop layer 106, the one or more front-end layers 104, semiconductor layer 102, and/or a given outer plate opening 112). In some instances, insulator layer 114 may be provided as a substantially conformal layer over such topography. In some other instances, insulator layer 114 may be provided with a non-uniform or otherwise varying thickness over such topography. For example, in some cases a first portion of insulator layer 114 may have a thickness within a first range while a second portion thereof has a thickness within a second, different range. Other suitable dimensions for insulator layer 114 will depend on a given application and will be apparent in light of this disclosure.

Also, as can be seen from FIG. 4C, a barrier/seed layer 116 may be formed over the surface of IC 100 (e.g., over insulator layer 114). In accordance with some embodiments, barrier/seed layer 116 may be configured to serve, at least in part, as: (1) a diffusion barrier to prevent or otherwise reduce diffusion of the material of metal layer 118 (discussed below) into surrounding layers; and (2) a seed layer for deposition of metal layer 118 (discussed below) within outer plate opening 112. To that end, in some cases, barrier/seed layer 116 may be configured as a stacked layer (e.g., a bi-layer) including, for example, a bi-layer of titanium and copper (Ti/Cu) and/or a bi-layer of tantalum and copper (Ta/Cu). It should be noted, however, that the present disclosure is not so limited to inclusion only of a barrier/seed layer 116 which includes copper (Cu), as in a more general sense, and in accordance with some other embodiments, the seed material selected may be made to match that which is utilized as metal layer 118. Other suitable configurations and materials for barrier/seed layer 116 will depend on a given application and will be apparent in light of this disclosure.

Barrier/seed layer 116 can be formed over IC 100 using any of a wide variety of techniques. For example, in accordance with some embodiments, barrier/seed layer 116 may be formed using: a physical vapor deposition (PVD) process; a chemical vapor deposition (CVD) process; and/or a combination of any one or more thereof. Other suitable techniques for forming barrier/seed layer 116 will depend on a given application and will be apparent in light of this disclosure.

Furthermore, the dimensions of barrier/seed layer 116 can be customized as desired for a given target application or end-use. For example, in some cases, a sufficient amount of barrier/seed layer 116 may be deposited over IC 100 so as to ensure that its barrier layer portion within outer plate opening 112 has a thickness in the range of about 5-20 nm (e.g., about 5-15 nm, or any other sub-range in the range of about 5-20 nm). In some example cases, a sufficient amount of barrier/seed layer 116 may be deposited over IC 100 so as to ensure that its seed layer portion within outer plate opening 112 has a thickness in the range of about 50-150 nm (e.g., about 75-125 nm, or any other sub-range in the range of about 50-150 nm). In some instances, barrier/seed layer 116 may have a substantially uniform thickness over the topography provided, for example, by any underlying layers of IC 100 (e.g., insulator layer 114). In some instances, barrier/seed layer 116 may be provided as a substantially conformal layer over such topography. In some other instances, barrier/seed layer 116 may be provided with a non-uniform or otherwise varying thickness over such topography. For example, in some cases a first portion of barrier/seed layer 116 may have a thickness within a first range while a second portion thereof has a thickness within a second, different range. Other suitable dimensions for barrier/seed layer 116 will depend on a given application and will be apparent in light of this disclosure.

As can be seen further from FIG. 4C, a metal layer 118 may be formed over the surface of IC 100 (e.g., over barrier/seed layer 116). As will be appreciated in light of this disclosure, metal layer 118 can be formed from any suitable electrically conductive metal (or combination of such materials). In some example cases, metal layer 118 may be formed from copper (Cu) and/or an alloy thereof. As will be appreciated further, metal layer 118 can be formed over IC 100 using any suitable technique, as typically done. In some example cases, metal layer 118 may be formed using an electroplating process. Other suitable materials and techniques for forming metal layer 118 will depend on a given application and will be apparent in light of this disclosure.

Also, as discussed below with reference to FIG. 4C, the dimensions of metal layer 118 can be customized as desired for a given target application or end-use. For example, in some cases, a sufficient amount of metal layer 118 may be deposited over IC 100 so as to ensure that it fills at least a portion of a given outer plate opening 112 (e.g., a remaining portion thereof after formation of insulator layer 114 and barrier/seed layer 116 therein). In some other instances, metal layer 118 may be provided with a non-uniform or otherwise varying thickness over the topography provided, for example, by any underlying layers of IC 100 (e.g., barrier layer 116). For example, in some cases a first portion of metal layer 118 may have a thickness within a first range while a second portion thereof has a thickness within a second, different range. In some cases, metal layer 118 may fill completely the remainder of outer plate opening 112 (e.g., after formation of barrier/seed layer 116 and insulator layer 114 therein). Other suitable dimensions for metal layer 118 will depend on a given application and will be apparent in light of this disclosure.

Figure 4D:
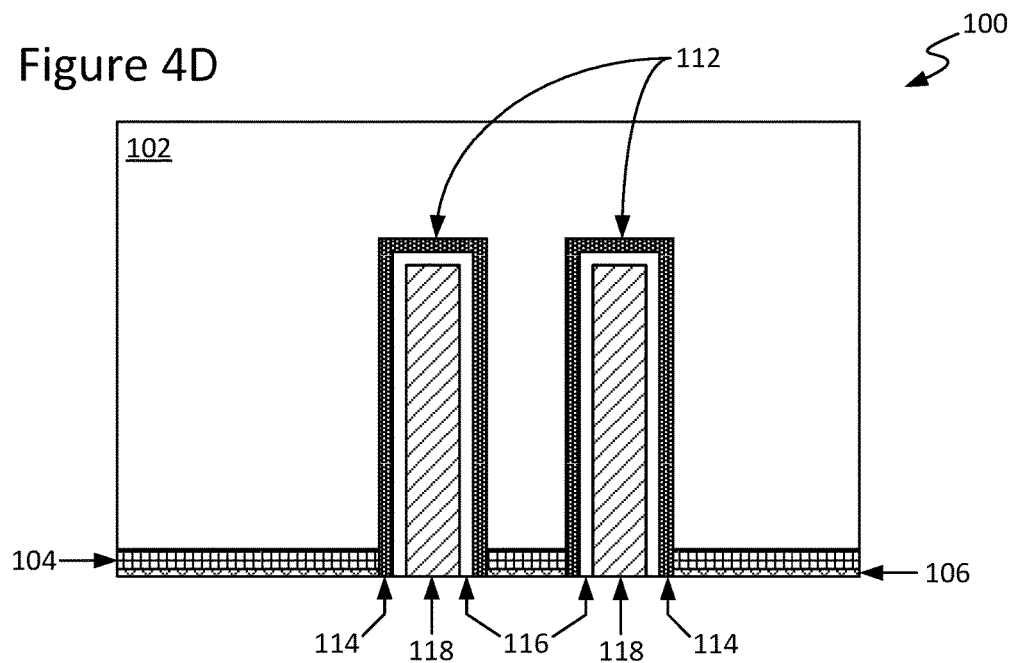
FIG. 4D is a cross-sectional view of the IC of FIG. 4C after planarization, in accordance with an embodiment of the present disclosure.

The process may continue as in FIG. 4D, which is a cross-sectional view of the IC 100 of FIG. 4C after planarization, in accordance with an embodiment of the present disclosure. As will be appreciated in light of this disclosure, it may be desirable in some instances to planarize IC 100, for example, to remove any undesired excess (e.g., overburden) of: (1) metal layer 118; (2) barrier/seed layer 116; and/or (3) insulator layer 114. To that end, IC 100 may undergo, for example: a chemical-mechanical planarization (CMP) process; an etch-and-clean process; and/or any other suitable planarization/polish process, as will be apparent in light of this disclosure. In some cases, the selected planarization process may be selective, for example, to polish stop layer 106 such that layer 106 remains substantially unaffected after the planarization process is completed. Other suitable techniques for planarizing IC 100 will depend on a given application and will be apparent in light of this disclosure.

After planarization, a portion of metal layer 118 may remain within outer plate opening 112. In accordance with some embodiments, this remainder of metal layer 118 may be utilized, for example, as an outer conductor plate (e.g., hereinafter outer conductor plate 118) of capacitor 101. As will be appreciated in light of this disclosure, the geometry and/or dimensions of outer conductor plate 118 may depend, at least in part, on the geometry and/or dimensions of its associated outer plate opening 112 and any additional layers therein (e.g., insulator layer 114; barrier/seed layer 116). Thus, in some cases, outer conductor plate 118 may have a length in the range of about 50-100 µm (e.g., about 50-75 µm, about 75-100 µm, or any other sub-range in the range of about 50-100 µm). In some cases in which outer plate opening 112 has a generally tubular geometry of generally annular cross-sectional profile, for example, outer conductor plate 118 may be substantially similar in geometry and profile. Other suitable geometries and dimensions for outer conductor plate 118 will depend on a given application and will be apparent in light of this disclosure.

Figure 4E:
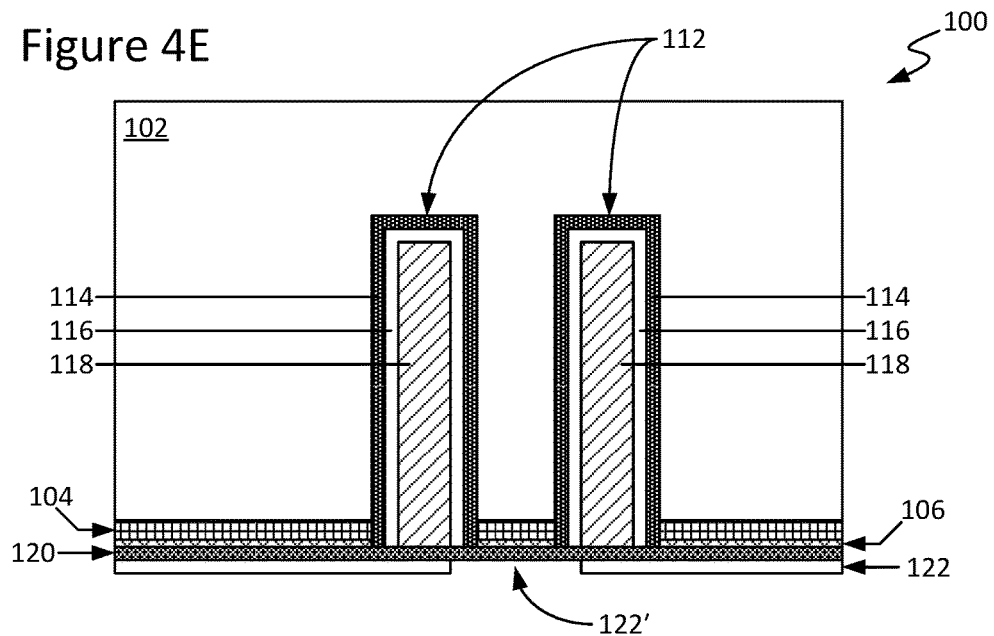
FIG. 4E is a cross-sectional view of the IC of FIG. 4D after forming a hardmask layer and a resist layer, in accordance with an embodiment of the present disclosure.

The process may continue as in FIG. 4E, which is a cross-sectional view of the IC 100 of FIG. 4D after forming a hardmask layer 120 and a resist layer 122, in accordance with an embodiment of the present disclosure. As can be seen from FIG. 4E, a hardmask layer 120 can be formed over the surface of IC 100 (e.g., over polish stop layer 106, and the exposed end of insulator layer 114, barrier/seed layer 116, and/or outer conductor plate 118). As will be appreciated in light of this disclosure, hardmask layer 120 can be formed from any of the example hardmask materials discussed above, for instance, with reference to hardmask layer 108, in accordance with some embodiments. As will be appreciated further, hardmask layer 120 can be formed using any of the example techniques discussed above, for instance, with reference to hardmask layer 108, in accordance with some embodiments.

Furthermore, the dimensions of hardmask layer 120 can be customized as desired for a given target application or end-use. For example, in some embodiments, hardmask layer 120 may have a thickness in the range of about 1.0-5.0 µm (e.g., about 1.0-2.5 µm, about 2.5-5.0 µm, or any other sub-range in the range of about 1.0-5.0 µm). In some instances, the thickness of hardmask layer 120 may be selected, at least in part, based on the desired depth of the opening 124 (discussed below) to be etched into IC 100. In some instances, hardmask layer 120 may have a substantially uniform thickness over the topography provided, for example, by any underlying layers of IC 100 (e.g., polish stop layer 106, insulator layer 114, barrier/seed layer 116, and/or outer conductor plate 118). In some instances, hardmask layer 120 may be provided as a substantially conformal layer over such topography. In some other instances, hardmask layer 120 may be provided with a non-uniform or otherwise varying thickness over such topography. For example, in some cases a first portion of hardmask layer 120 may have a thickness within a first range while a second portion thereof has a thickness within a second, different range. Other suitable configurations, dimensions, materials, and techniques for forming hardmask layer 120 will depend on a given application and will be apparent in light of this disclosure.

Also, as can be seen further from FIG. 4E, a resist layer 122 may be formed over the surface of IC 100 (e.g., over hardmask layer 120). As will be appreciated in light of this disclosure, resist layer 122 can be formed from any of the example resist materials discussed above, for instance, with reference to resist layer 110, in accordance with some embodiments. As will be appreciated further, resist layer 122 can be formed (e.g., deposited, exposed, and/or developed) using any of the example techniques discussed above, for instance, with reference to resist layer 110, in accordance with some embodiments. Other suitable materials and techniques for forming resist layer 122 will depend on a given application and will be apparent in light of this disclosure.

Furthermore, the dimensions of resist layer 122 can be customized as desired for a given target application or end-use. For example, in some embodiments, resist layer 122 may have a thickness in the range of about 0.3-5.0 µm (e.g., about 0.3-2.5 µm, about 2.5-5.0 µm, or any other sub-range in the range of about 0.3-5.0 µm). In some instances, resist layer 122 may have a substantially uniform thickness over the topography provided, for example, by any underlying layers of IC 100 (e.g., hardmask layer 120). In some instances, resist layer 122 may be provided as a substantially conformal layer over such topography. In some other instances, resist layer 122 may be provided with a non-uniform or otherwise varying thickness over such topography. For example, in some cases a first portion of resist layer 122 may have a thickness within a first range while a second portion thereof has a thickness within a second, different range. Other suitable dimensions for resist layer 122 will depend on a given application and will be apparent in light of this disclosure.

In accordance with some embodiments, resist layer 122 may be processed so as to form one or more openings 122' therein. In accordance with some embodiments, an opening 122' may be formed over a region of IC 100 in which the inner plate opening 124 (discussed below) is to be formed. The dimensions of a given opening 122' of resist layer 122 can be customized as desired for a given target application or end-use. A given opening 122' may be provided with a depth, for example, that traverses the entire thickness of resist layer 122, thus exposing the surface of underlying hardmask layer 120, in some cases. Also, as will be appreciated in light of this disclosure, the width of a given opening 122' may determine, at least in part, the width/diameter ($W_I$) of the inner plate opening 124 (discussed below) that may be formed there under. Other suitable dimensions for the one or more openings 122' will depend on a given application and will be apparent in light of this disclosure.

Figure 4F:
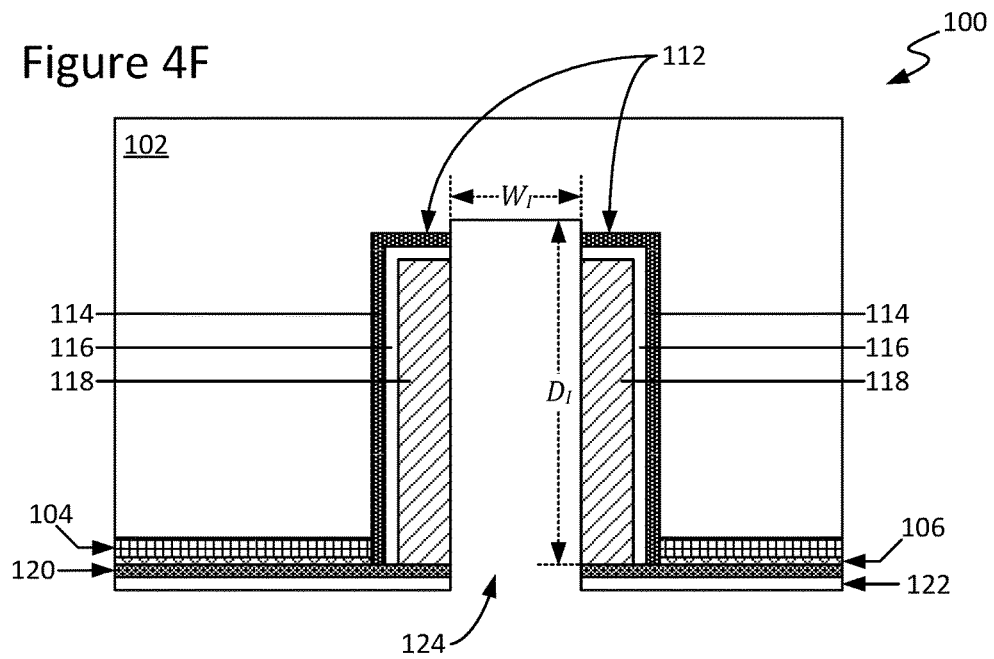
FIG. 4F is a cross-sectional view of the IC of FIG. 4E after forming an inner plate opening, in accordance with an embodiment of the present disclosure.

The process may continue as in FIG. 4F, which is a cross-sectional view of the IC 100 of FIG. 4E after forming an inner plate opening 124, in accordance with an embodiment of the present disclosure. Inner plate opening 124 may be formed in IC 100, in accordance with some embodiments, by utilizing patterned resist layer 122 (e.g., patterned with one or more openings 122') as a mask and etching through hardmask layer 120, polish stop layer 106, barrier/seed layer 116, insulator layer 114, and/or the one or more front-end layers 104, and into semiconductor layer 102. To that end, inner plate opening 124 may be formed, in accordance with some embodiments, using an anisotropic dry plasma etching process. The etch chemistry can be customized, as desired, and in some instances may be one, for example, that can be utilized in pulsed or time-multiplexed (e.g., Bosch process) etching. In some cases, the selected etch process may be selective to the material of outer conductor plate 118 (e.g., Cu), but not selective to the material of insulator layer 114 (e.g., $SiO_2$) or the material of barrier/seed layer 116 (e.g., Ti; Ta), so that, during the etch process, a portion of insulator layer 114 and barrier/seed layer 116 are removed from the inner sidewalls of the outer conductor plate 118 of the capacitor 101 while the outer conductor plate 118 remains substantially intact (e.g., unaffected or otherwise negligibly affected). Thus, in a sense, the location of inner conductor plate 132 (discussed below) may be considered self-aligned to the location of outer conductor plate 118, in accordance with some embodiments. Other suitable techniques for forming inner plate opening 124 will depend on a given application and will be apparent in light of this disclosure.

As discussed herein, inner plate opening 124 may be configured, in accordance with some embodiments, to host, at least in part: (1) a barrier layer 126; (2) a capacitor dielectric layer 128; (3) a barrier/seed layer 130; and/or (4) the inner conductor plate 132 of capacitor 101. To that end, the geometry and/or dimensions of inner plate opening 124 can be customized as desired for a given target application or end-use, in accordance with some embodiments. For instance, in some cases, inner plate opening 124 may have a generally cylindrical geometry that may be generally circular in cross-sectional profile. In some embodiments, inner plate opening 124 may have a depth ($D_I$), for example, in the range of about 50-100 μm (e.g., about 50-75 μm, about 75-100 μm, or any other sub-range in the range of about 50-100 μm). In some instances, inner plate opening 124 may be provided with a depth $D_I$ that is slightly greater than (e.g., within about 20% of) the depth $D_O$ of outer plate opening 112, discussed above. In some embodiments, inner plate opening 124 may have a width/diameter ($W_I$), for example, in the range of about 2-10 μm (e.g., about 2-6 μm, about 6-10 μm, or any other sub-range in the range of about 2-10 μm). Other suitable geometries and dimensions for inner plate opening 124 will depend on a given application and will be apparent in light of this disclosure.

The process may continue as in FIG. 4G, which is a cross-sectional view of the IC 100 of FIG. 4F after removing any remaining patterned resist layer 122 and hardmask layer 120 and after forming a barrier layer 126, a dielectric layer 128, a barrier/seed layer 130, and a metal layer 132, in accordance with an embodiment of the present disclosure. As can be seen, any remaining resist layer 122 and hardmask layer 120 can be removed from IC 100. It should be noted, however, that in some cases, the etch time for forming inner plate opening 124 may be sufficiently lengthy, for example, such that resist layer 122 may be etched away, in part or in whole, during such etch processing. Also, in some cases, there may be one or more additional cleans, for example, to remove any etch polymer that may have formed during the etch processing of insulator layer 102 to form inner plate opening 124. Other suitable techniques for removing the remainder, if any, of resist layer 122 and/or hardmask layer 120 will depend on a given application and will be apparent in light of this disclosure.

As can be seen from FIG. 4G, a barrier layer 126 may be formed over the surface of IC 100 (e.g., over the topography provided by polish stop layer 106, insulator layer 114, barrier/seed layer 116, outer conductor plate 118, semiconductor layer 102, and/or inner plate opening 124). In accordance with some embodiments, barrier layer 126 may be configured to serve, at least in part, as a diffusion barrier to prevent or otherwise reduce diffusion of the material of metal layer 118 into surrounding layers. As will be appreciated in light of this disclosure, barrier layer 126 can be formed from any of the example barrier layer materials discussed above, for instance, with reference to barrier/seed layer 116, in accordance with some embodiments. In some other embodiments, barrier layer 126 may be formed from tantalum (Ta), titanium (Ti), titanium nitride (TiN), tantalum nitride (TaN), and/or a combination of any one or more thereof. In some cases, the material composition of barrier/seed layer 116 and barrier layer 126 may differ from one another, and thus those layers 116 and 126 may remain physically distinct from one another at their interface over IC 100. In some other cases, however, barrier/seed layer 116 and barrier layer 126 may have similar material compositions, and thus the physical distinction between those layers 116 and 126 may be eliminated or otherwise reduced at their interface over IC 100. As will be appreciated further, barrier layer 126 can be formed using any of the example techniques discussed above, for instance, with reference to barrier/seed layer 116, in accordance with some embodiments. Other suitable materials and techniques for forming barrier layer 126 will depend on a given application and will be apparent in light of this disclosure.

Furthermore, the dimensions of barrier layer 126 can be customized as desired for a given target application or end-use. For example, in some cases, a sufficient amount of barrier layer 126 may be deposited over IC 100 so as to ensure that a portion thereof within inner plate opening 124 has a thickness in the range of about 5-20 nm (e.g., about 5-15 nm, or any other sub-range in the range of about 5-20 nm). In some instances, barrier layer 126 may have a substantially uniform thickness over the topography provided, for example, by any underlying layers of IC 100 (e.g., polish stop layer 106, insulator layer 114, barrier/seed layer 116, outer conductor plate 118, semiconductor layer 102, and/or inner plate opening 124). In some instances, barrier layer 126 may be provided as a substantially conformal layer over such topography. In some other instances, barrier layer 126 may be provided with a non-uniform or otherwise varying thickness over such topography. For example, in some cases a first portion of barrier layer 126 may have a thickness within a first range while a second portion thereof has a thickness within a second, different range. Other suitable dimensions for barrier layer 126 will depend on a given application and will be apparent in light of this disclosure.

As can be seen further from FIG. 4G, a dielectric layer 128 may be formed over the surface of IC 100 (e.g., over barrier layer 126). In accordance with some embodiments, dielectric layer 128 may be configured to serve, at least in part, as the intermediate insulating/dielectric layer of capacitor 101. To that end, dielectric layer 128 can be formed from any suitable dielectric or insulator material (or combination of such materials). For example, in some embodiments, dielectric layer 128 may be formed from: hafnium oxide (HfO$_2$); aluminum oxide (Al$_2$O$_3$); silicon dioxide (SiO$_2$); zirconium dioxide (ZrO$_2$); hathium silicate (HfSiO$_4$); zirconium silicate (ZrSiO$_4$); and/or a combination of any one or more thereof. In some cases, dielectric layer 128 may be a dielectric material having a dielectric constant (κ-value) greater than or equal to about 3.9 (e.g., greater than or equal to about 5.0; greater than or equal to about 10.0; greater than or equal to about 15.0; greater than or equal to about 20.0; greater than or equal to about 25.0). In some other cases, dielectric layer 128 may be a dielectric material having a κ-value less than about 3.9 (e.g., less than about 3.0; less than about 2.0; less than about 1.0). In a more general sense, the material composition and dielectric properties of dielectric layer 128 can be customized as desired for a given target application or end-use, in accordance with some embodiments. Other suitable materials for dielectric layer 128 will depend on a given application and will be apparent in light of this disclosure.

Dielectric layer 128 can be formed over IC 100 using any of a wide variety of techniques. For example, in accordance with some embodiments, dielectric layer 128 may be formed using: an atomic layer deposition (ALD) process; a chemical vapor deposition (CVD) process, such as plasma-enhanced CVD (PECVD); and/or a combination of any one or more thereof. Other suitable techniques for forming dielectric layer 128 will depend on a given application and will be apparent in light of this disclosure.

Furthermore, the dimensions of dielectric layer 128 can be customized as desired for a given target application or end-use. For example, in some embodiments, a sufficient amount of dielectric layer 128 may be deposited over IC 100 so as to ensure that a portion thereof within inner plate opening 124 has a thickness in the range of about 50-200 nm (e.g., about 50-125 nm, about 125-200 nm, or any other sub-range in the range of about 50-200 nm). In some instances, dielectric layer 128 may have a substantially uniform thickness over the topography provided, for example, by any underlying layers of IC 100 (e.g., barrier layer 126). In some instances, dielectric layer 128 may be provided as a substantially conformal layer over such topography. In some other instances, dielectric layer 128 may be provided with a non-uniform or otherwise varying thickness over such topography. For example, in some cases a first portion of dielectric layer 128 may have a thickness within a first range while a second portion thereof has a thickness within a second, different range. Other suitable dimensions for dielectric layer 128 will depend on a given application and will be apparent in light of this disclosure.

In addition, as can be seen from FIG. 4G, a barrier/seed layer 130 may be formed over the surface of IC 100 (e.g., over dielectric layer 128). In accordance with some embodiments, barrier/seed layer 130 may be configured to serve, at least in part, as: (1) a diffusion barrier to prevent or otherwise reduce diffusion of the material of metal layer 132 (discussed below) into surrounding layers; and (2) a seed layer for deposition of metal layer 132 (discussed below) within inner plate opening 124. To that end, in some cases, barrier/seed layer 130 may be configured as a stacked layer (e.g., a bi-layer) including, for example, a bi-layer of titanium and copper (Ti/Cu) and/or a bi-layer of tantalum and copper (Ta/Cu). It should be noted, however, that the present disclosure is not so limited to inclusion only of a barrier/seed layer 130 which includes copper (Cu), as in a more general sense, and in accordance with some other embodiments, the seed material selected may be made to match that which is utilized as metal layer 132. Also, as will be appreciated in light of this disclosure, barrier/seed layer 130 can be formed using any of the example techniques discussed above, for instance, with reference to barrier/seed layer 116, in accordance with some embodiments. Other suitable configurations, materials, and techniques for forming barrier/seed layer 130 will depend on a given application and will be apparent in light of this disclosure.

Furthermore, the dimensions of barrier/seed layer 130 can be customized as desired for a given target application or end-use. For example, in some cases, a sufficient amount of barrier/seed layer 130 may be deposited over IC 100 so as to ensure that its barrier layer portion within inner plate opening 124 has a thickness in the range of about 5-20 nm (e.g., about 5-15 nm, or any other sub-range in the range of about 5-20 nm). In some example cases, a sufficient amount of barrier/seed layer 130 may be deposited over IC 100 so as to ensure that its seed layer portion within inner plate opening 124 has a thickness in the range of about 50-150 nm (e.g., about 75-125 nm, or any other sub-range in the range of about 50-150 nm). In some instances, barrier/seed layer 130 may have a substantially uniform thickness over the topography provided, for example, by any underlying layers of IC 100 (e.g., dielectric layer 128). In some instances, barrier/seed layer 130 may be provided as a substantially conformal layer over such topography. In some other instances, barrier/seed layer 130 may be provided with a non-uniform or otherwise varying thickness over such topography. For example, in some cases a first portion of barrier/seed layer 130 may have a thickness within a first range while a second portion thereof has a thickness within a second, different range. Other suitable dimensions for barrier/seed layer 130 will depend on a given application and will be apparent in light of this disclosure.

As can be seen further from FIG. 4G, a metal layer 132 may be formed over the surface of IC 100 (e.g., over barrier/seed layer 130). As will be appreciated in light of this disclosure, metal layer 132 can be formed from any of the example electrically conductive materials discussed above, for instance, with reference to metal layer 118, in accordance with some embodiments. As will be appreciated further, metal layer 132 can be formed using any of the example techniques discussed above, for instance, with reference to metal layer 118, in accordance with some embodiments. Other suitable materials and techniques for forming metal layer 132 will depend on a given application and will be apparent in light of this disclosure.

Also, as discussed below with reference to FIG. 4H, the dimensions of metal layer 132 can be customized as desired for a given target application or end-use. For example, in some cases, a sufficient amount of metal layer 132 may be deposited over IC 100 so as to ensure that it fills at least a portion of inner plate opening 124 (e.g., a remaining portion thereof after formation of barrier layer 126, dielectric layer 128, and barrier/seed layer 130 therein). In some other instances, metal layer 132 may be provided with a non-uniform or otherwise varying thickness over the topography provided, for example, by any underlying layers of IC 100 (e.g., barrier/seed layer 130). For example, in some cases a first portion of metal layer 132 may have a thickness within a first range while a second portion thereof has a thickness within a second, different range. In some cases, metal layer 132 may fill completely the remainder of inner plate opening 124 (e.g., after formation of barrier layer 126, dielectric layer 128, and barrier/seed layer 130 therein). Other suitable dimensions for metal layer 132 will depend on a given application and will be apparent in light of this disclosure.

The process may continue as in FIG. 4H, which is a cross-sectional view of the IC 100 of FIG. 4G after planarization, in accordance with an embodiment of the present disclosure. As will be appreciated in light of this disclosure, it may be desirable in some instances to planarize IC 100, for example, to remove any undesired excess (e.g., overburden) of: (1) metal layer 132; (2) barrier/seed layer 130; (3) dielectric layer 128; and/or (4) barrier layer 126. To that end, IC 100 may undergo, for example: a chemical-mechanical planarization (CMP) process; an etch-and-clean process; and/or any other suitable planarization/polish process, as will be apparent in light of this disclosure. In some cases, the selected planarization/polish process may be selective, for example, to polish stop layer 106 such that layer 106 remains substantially unaffected after the planarization/polish process is completed. Other suitable techniques for planarizing IC 100 will depend on a given application and will be apparent in light of this disclosure.

After planarization, a portion of metal layer 132 may remain within inner plate opening 124. In accordance with some embodiments, this remainder of metal layer 132 may be utilized, for example, as an inner conductor plate (e.g., hereinafter inner conductor plate 132) of capacitor 101. As will be appreciated in light of this disclosure, the geometry and/or dimensions of inner conductor plate 132 may depend, at least in part, on the geometry and/or dimensions of its associated inner plate opening 124 and any additional layers therein (e.g., barrier layer 126, dielectric layer 128, and barrier/seed layer 130). Thus, in some cases, inner conductor plate 132 may have a length in the range of about 50-100 µm (e.g., about 50-75 µm, about 75-100 µm, or any other sub-range in the range of about 50-100 µm). In some instances, inner conductor plate 132 may have a width/diameter, for example, the range of about 2-10 µm (e.g., about 2-6 µm, about 6-10 µm, or any other sub-range in the range of about 2-10 µm). In some cases in which inner plate opening 124 has a generally cylindrical geometry of generally circular cross-sectional profile, for example, inner conductor plate 132 may be substantially similar in geometry and profile. In some instances, inner conductor plate 132 may be configured, for example, as a through-body via (TBV). Also, as previously noted, in some embodiments, the location of inner conductor plate 132 can be considered self-aligned, for example, to the location of outer conductor plate 118. Other suitable geometries and dimensions for inner conductor plate 132 will depend on a given application and will be apparent in light of this disclosure.

Figure 4I:
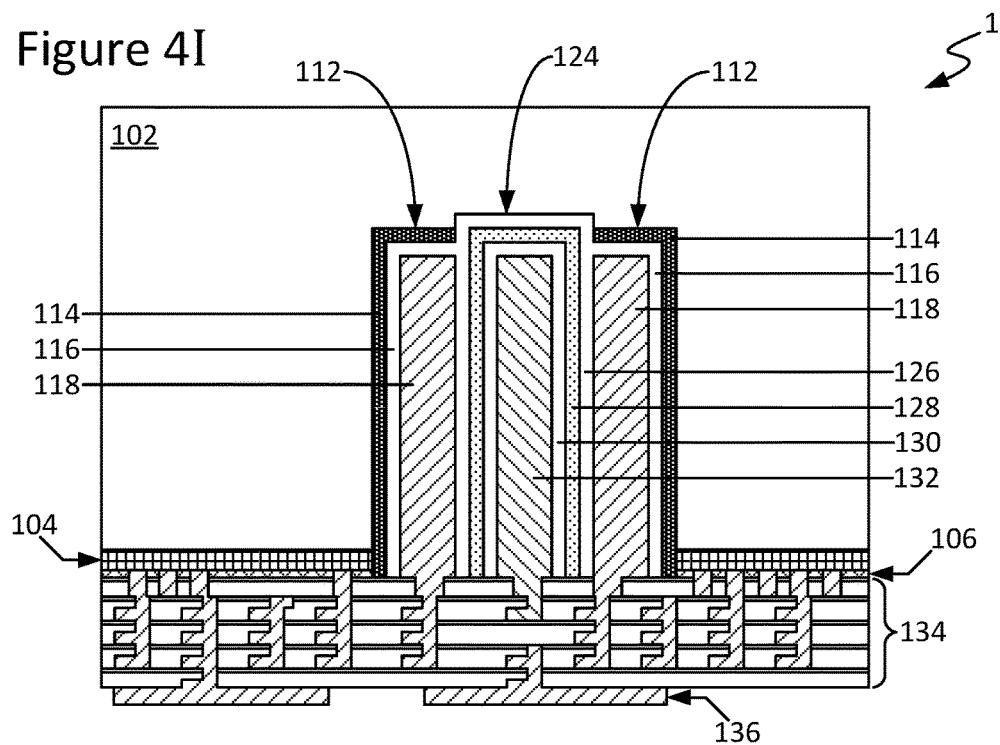
FIG. 4I is a cross-sectional view of the IC of FIG. 4H after formation of one or more back-end layers and a metal bump layer, in accordance with an embodiment of the present disclosure.

The process may continue as in FIG. 4I, which is a cross-sectional view of the IC 100 of FIG. 4H after formation of one or more back-end layers 134 and a metal bump layer 136, in accordance with an embodiment of the present disclosure. As can be seen, IC 100 may include one or more back-end layers 134 formed there over. In some embodiments, back-end layer(s) 134 may be formed, at least in part, over polish stop layer 106. However, the present disclosure is not so limited, as in some other embodiments, it may be desirable to remove polish stop layer 106, in part or in whole, prior to forming the one or more back-end layers 134 over IC 100. Numerous configurations will be apparent in light of this disclosure. In accordance with some embodiments, back-end layer(s) 134 may include: (1) one or more back-end wiring layers; (2) one or more far-back-end passivation layers; and/or (3) one or more metal redistribution layers (RDLs). In some instances, back-end layer(s) 134 may include one or more de-coupling capacitors. In some instances, back-end layer(s) 134 may include one or more random-access memory devices, such as embedded dynamic random-access memory (eDRAM) and/or spin-transfer torque random-access memory (STT-RAM). In some cases, the one or more back-end layers 134 may provide structure upon which an additional layer and/or component can be populated. Other suitable layers and/or devices which can be included in the one or more back-end layers 134 of IC 100 will depend on a given application and will be apparent in light of this disclosure.

As can be seen further from FIG. 4I, IC 100 may include a metal bump layer 136 formed there over (e.g., over the one or more back-end layers 134). Metal bump layer 136 can be formed using any suitable electrically conductive metal (or combination of such materials), as typically done. For example, in some cases, metal bump layer 136 may be formed from: a lead-tin (Pb—Sn) solder; a tin-silver (Sn—Ag) solder; a tin-copper (Sn—Cu) solder; gold (Au); and/or a combination of any one or more thereof. Also, metal bump layer 136 can be formed over IC 100 using any suitable technique, as typically done. Furthermore, the dimensions of metal bump layer 136 can be customized as desired for a given target application or end-use. Other suitable materials, dimensions, and techniques for forming metal bump layer 136 will depend on a given application and will be apparent in light of this disclosure.

Figure 4J:
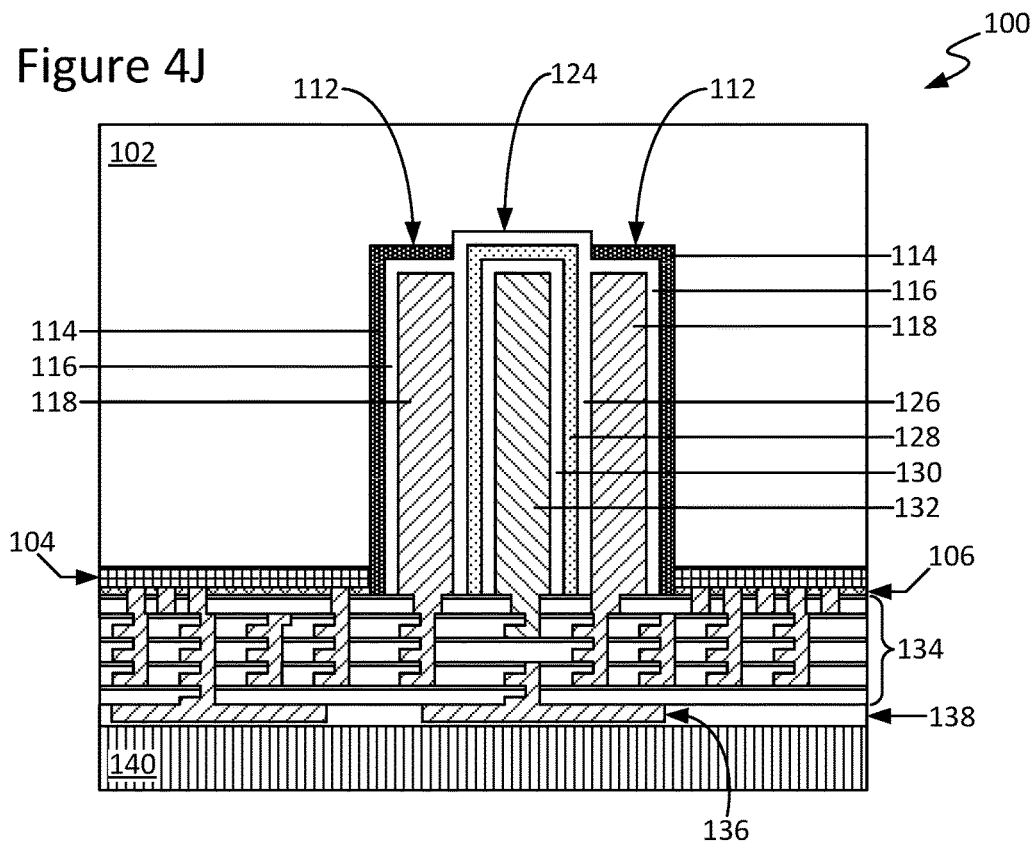
FIG. 4J is a cross-sectional view of the IC of FIG. 4I after depositing an adhesive layer and bonding with a carrier substrate, in accordance with an embodiment of the present disclosure.

The process may continue as in FIG. 4J, which is a cross-sectional view of the IC 100 of FIG. 4I after depositing an adhesive layer 138 and bonding with a carrier substrate 140, in accordance with an embodiment of the present disclosure. As can be seen, an adhesive layer 138 can be deposited over the surface of IC 100 (e.g., over metal bump layer 136 and one or more back-end layers 134). Adhesive layer 138 can be formed from any suitable adhesive bonding material (or combination of such materials), as typically done. For instance, adhesive layer 138 can be formed from a solvent-release glue, a laser-release glue, and/or a thermal-release glue, in accordance with some embodiments. Also, as will be appreciated in light of this disclosure, adhesive layer 138 can be formed over IC 100 using any suitable technique, as typically done. Furthermore, the amount of adhesive material used for adhesive layer 138 can be customized as desired for a given target application or end-use. Other suitable materials, quantities, and techniques for forming adhesive layer 138 will depend on a given application and will be apparent in light of this disclosure.

In accordance with some embodiments, carrier substrate 140 can be bonded with the surface of IC 100 in a temporary manner or as otherwise desired. The material composition and configuration of carrier substrate 140 can be customized as desired for a given target application or end-use. In some cases, carrier substrate 140 may be, for example, a bare silicon wafer or a glass wafer. In some cases, if adhesive layer 138 includes a solvent-release glue, then carrier substrate 140 may include perforations, for example, to assist with application of a solvent for purposes of de-bonding carrier substrate 140 from IC 100. In some cases, if adhesive layer 138 includes a laser-release glue, then carrier substrate 140 may be transparent, for example, to assist with application of laser light for purposes of de-bonding carrier substrate 140 from IC 100. Also, the dimensions of carrier substrate 140 can be customized as desired for a given target application or end-use. Other suitable materials, configurations, and dimensions for carrier substrate 140 will depend on a given application and will be apparent in light of this disclosure.

Figure 4K:
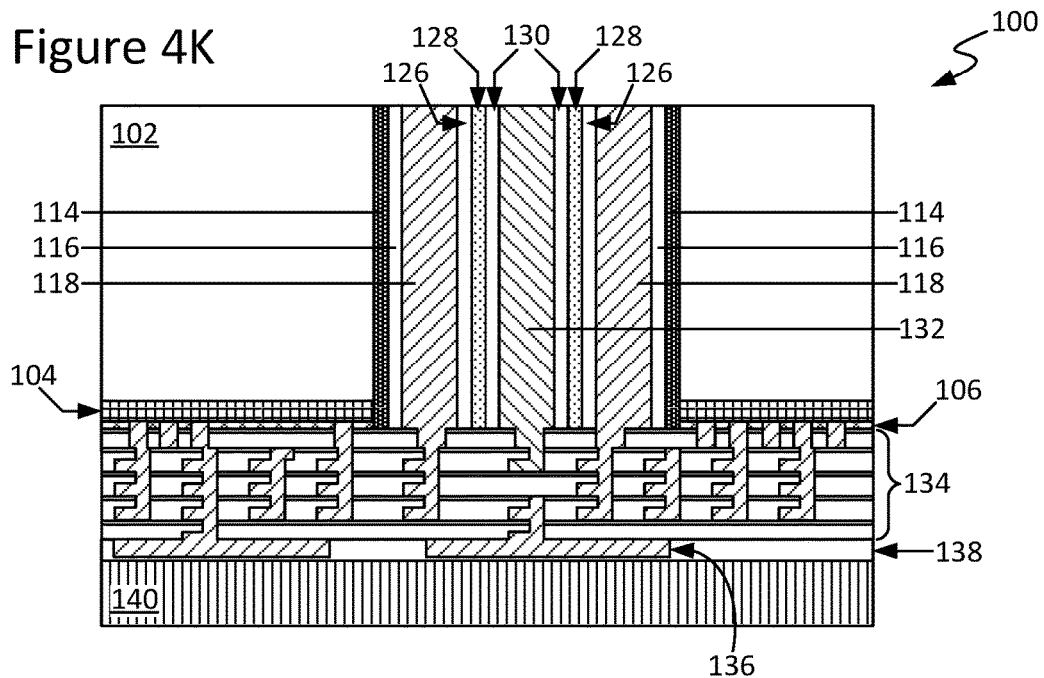
FIG. 4K is a cross-sectional view of the IC of FIG. 4J after thinning thereof, in accordance with an embodiment of the present disclosure.

The process may continue as in FIG. 4K, which is a cross-sectional view of the IC 100 of FIG. 4J after thinning thereof, in accordance with an embodiment of the present disclosure. IC 100 can undergo thinning, in accordance with some embodiments, to remove any undesired portion of: (1) semiconductor layer 102; (2) barrier layer 126; (3) insulator layer 114; (4) dielectric layer 128; (5) barrier/seed layer 116; and/or (6) barrier/seed layer 130. To that end, IC 100 may undergo, for example: a grinding process; a chemical-mechanical planarization (CMP) process; an etch-and-clean process (e.g., using plasma etching and/or bulk silicon etchants); and/or any other suitable planarization/polish process, as will be apparent in light of this disclosure. In some cases, after thinning, the inner conductor plate 132 and the outer conductor plate 118 of capacitor 101 may be exposed at the surface of IC 100, revealing the exposed end of capacitor 101 for additional processing, if desired. Also, after thinning, IC 100 may undergo one or more cleaning processes, for example, to remove any copper (Cu) or other conductive metal (from which plates 132 and 118 may be made) from the surface of semiconductor layer 102. In accordance with some embodiments, this can help to prevent or otherwise reduce diffusion of the metal through semiconductor layer 102 and into the one or more front-end layers 104. In some instances, this may help to minimize or otherwise reduce transistor device performance degradation. Other suitable techniques for thinning IC 100 will depend on a given application and will be apparent in light of this disclosure.

Figure 4L:
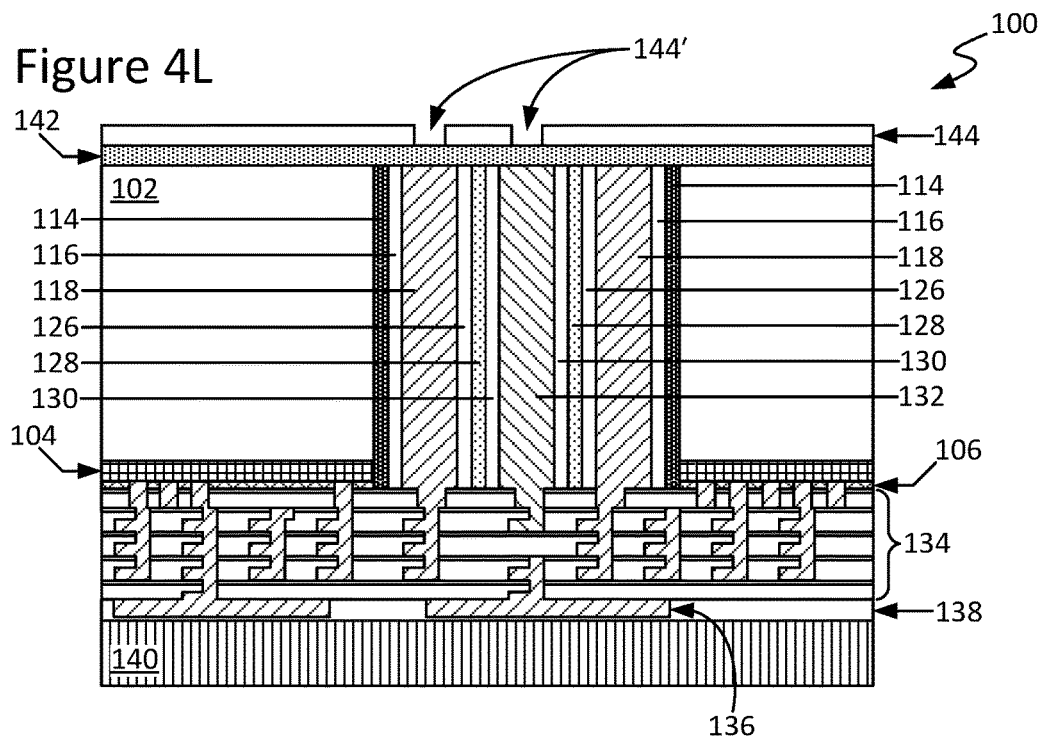
FIG. 4L is a cross-sectional view of the IC of FIG. 4K after forming a dielectric layer and a resist layer, in accordance with an embodiment of the present disclosure.

The process may continue as in FIG. 4L, which is a cross-sectional view of the IC 100 of FIG. 4K after forming a dielectric layer 142 and a resist layer 144, in accordance with an embodiment of the present disclosure. As can be seen, a dielectric layer 142 may be formed over the surface of IC 100 (e.g., over the topography provided by semiconductor layer 102, insulator layer 114, barrier/seed layer 116, outer conductor plate 118, barrier layer 126, dielectric layer 128, barrier/seed layer 130, and/or inner conductor plate 132). Dielectric layer 142 can be formed from any of a wide range of suitable dielectric materials. For example, in some cases, dielectric layer 142 may be formed from: silicon nitride ($Si_3N_4$); silicon carbide (SiC); silicon dioxide ($SiO_2$); and/or a combination of any one or more thereof. In some cases, dielectric layer 142 may serve, at least in part, as a passivation layer which provides a hermetic barrier that protects underlying semiconductor layer 102 from trace metal and/or moisture contamination, in accordance with some embodiments. Also, dielectric layer 142 can be formed over IC 100 using any suitable technique, and in some cases may be formed, for example, using a chemical vapor deposition (CVD) process, such as a plasma-enhanced CVD (PECVD) process. Other suitable materials and techniques for forming dielectric layer 142 will depend on a given application and will be apparent in light of this disclosure.

Furthermore, the dimensions of dielectric layer 142 can be customized as desired for a given target application or end-use. For example, in some embodiments, dielectric layer 142 may have a thickness in the range of about 0.5-2.0 μm (e.g., about 0.5-1.25 μm, about 1.25-2.0 μm, or any other sub-range in the range of about 0.5-2.0 μm). In some instances, dielectric layer 142 may have a substantially uniform thickness over the topography provided, for example, by any underlying layers of IC 100 (e.g., semiconductor layer 102, insulator layer 114, barrier/seed layer 116, outer conductor plate 118, barrier layer 126, dielectric layer 128, barrier/seed layer 130, and/or inner conductor plate 132). In some instances, dielectric layer 142 may be provided as a substantially conformal layer over such topography. In some other instances, dielectric layer 142 may be provided with a non-uniform or otherwise varying thickness over such topography. For example, in some cases a first portion of dielectric layer 142 may have a thickness within a first range while a second portion thereof has a thickness within a second, different range. Other suitable dimensions for dielectric layer 142 will depend on a given application and will be apparent in light of this disclosure.

As can be seen, a resist layer 144 may be formed over the surface of IC 100 (e.g., over dielectric layer 142). As will be appreciated in light of this disclosure, resist layer 144 can be formed from any of the example resist materials discussed above, for instance, with reference to resist layer 110, in accordance with some embodiments. As will be appreciated further, resist layer 144 can be formed (e.g., deposited, exposed, and/or developed) using any of the example techniques discussed above, for instance, with reference to resist layer 110, in accordance with some embodiments. Other suitable materials and techniques for forming resist layer 144 will depend on a given application and will be apparent in light of this disclosure.

Also, the dimensions of resist layer 144 can be customized as desired for a given target application or end-use. For example, in some embodiments, resist layer 144 may have a thickness in the range of about 0.3-5.0 μm (e.g., about 0.3-2.5 μm, about 2.5-5.0 μm, or any other sub-range in the range of about 0.3-5.0 μm). In some instances, resist layer 144 may have a substantially uniform thickness over the topography provided, for example, by any underlying layers of IC 100 (e.g., dielectric layer 142). In some instances, resist layer 144 may be provided as a substantially conformal layer over such topography. In some other instances, resist layer 144 may be provided with a non-uniform or otherwise varying thickness over such topography. For example, in some cases a first portion of resist layer 144 may have a thickness within a first range while a second portion thereof has a thickness within a second, different range. Other suitable dimensions for resist layer 144 will depend on a given application and will be apparent in light of this disclosure.

In accordance with some embodiments, resist layer 144 may be processed so as to form one or more openings 144' therein. In accordance with some embodiments, a given opening 144' may be formed in resist layer 144 at a location over outer conductor plate 118 of capacitor 101. Similarly, and in accordance with some embodiments, an opening 144' may be formed in resist layer 144 at a location over inner conductor plate 132 of capacitor 101. The dimensions of a given opening 144' of resist layer 144 can be customized as desired for a given target application or end-use. A given opening 144' may be provided with a depth, for example, that traverses the entire thickness of resist layer 144, thus exposing the surface of underlying dielectric layer 142, in some cases. Also, as will be appreciated in light of this disclosure, the width of a given opening 144' may determine, at least in part, the dimensions of a corresponding opening 142' (discussed below) which may be formed within dielectric layer 142. Other suitable dimensions for the one or more openings 144' will depend on a given application and will be apparent in light of this disclosure.

Figure 4M:
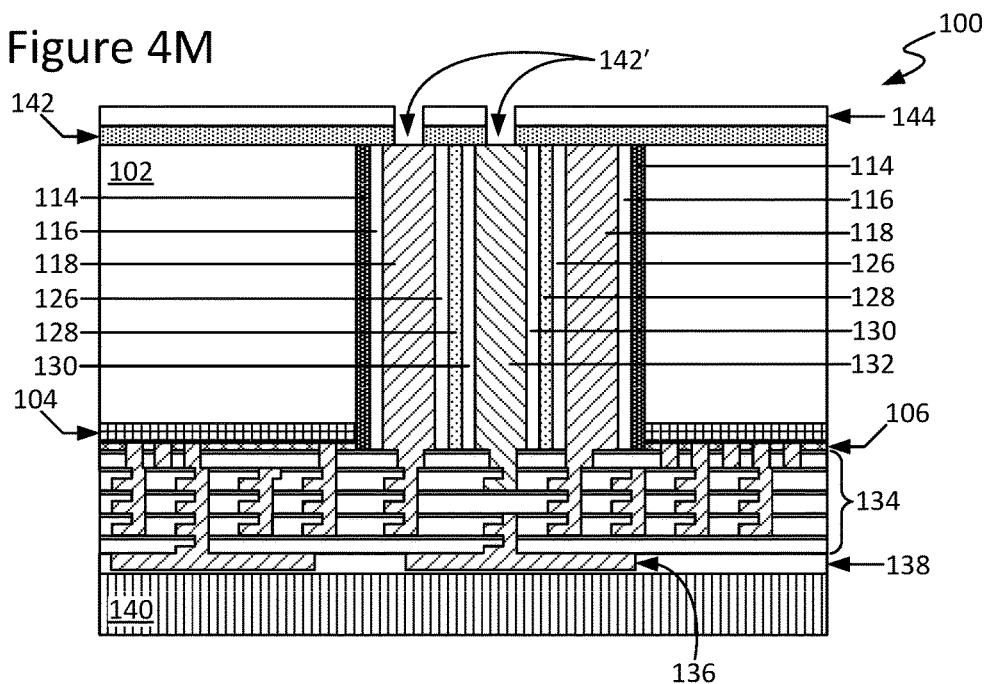
FIG. 4M is a cross-sectional view of the IC of FIG. 4L after patterning the dielectric layer, in accordance with an embodiment of the present disclosure.

The process may continue as in FIG. 4M, which is a cross-sectional view of the IC 100 of FIG. 4L after patterning dielectric layer 142, in accordance with an embodiment of the present disclosure. As can be seen, one or more openings 142' may be formed in dielectric layer 142. In accordance with some embodiments, dielectric layer 142 can be processed such that an opening 142' is formed over outer conductor plate 118 of capacitor 101, and another opening 142' is formed over inner conductor plate 132 of capacitor 101. As discussed herein, by virtue of such a configuration, the openings 142' may allow for electrical terminal connections to the inner conductor plate 132 and the outer conductor plate 118, in accordance with some embodiments. Also, as will be appreciated in light of this disclosure, the dimensions (e.g., width) of a given opening 142' can be customized as desired for a given target application or end-use and may depend, at least in part, on the dimensions (e.g., width) of an opening 144' of resist layer 144 associated therewith.

Opening(s) 142' may be formed, in accordance with some embodiments, by utilizing patterned resist layer 144 (e.g., patterned with one or more openings 144') as a mask and etching through dielectric layer 142. To that end, opening(s) 142' may be formed, in accordance with some embodiments, using an anisotropic dry plasma etching process and/or a wet etching process. The etch chemistry can be customized, as desired, and in some instances may be one, for example, that can be utilized in pulsed or time-multiplexed (e.g., Bosch process) etching. In some cases in which dielectric layer 142 includes silicon nitride ($Si_3N_4$), for example, a wet etch chemistry utilizing hydrofluoric (HF) acid or buffered HF (e.g., $NH_4F/HF$) acid, or hot phosphoric ($H_3PO_4$) acid may be used to etch opening(s) 142'. In some instances it may be desirable to stop etching dielectric layer 142, for example, when underlying inner conductor plate 132 and/or outer conductor plate 118 are reached. Other suitable techniques for forming a given opening 142' in dielectric layer 142 will depend on a given application and will be apparent in light of this disclosure.

Figure 4N:
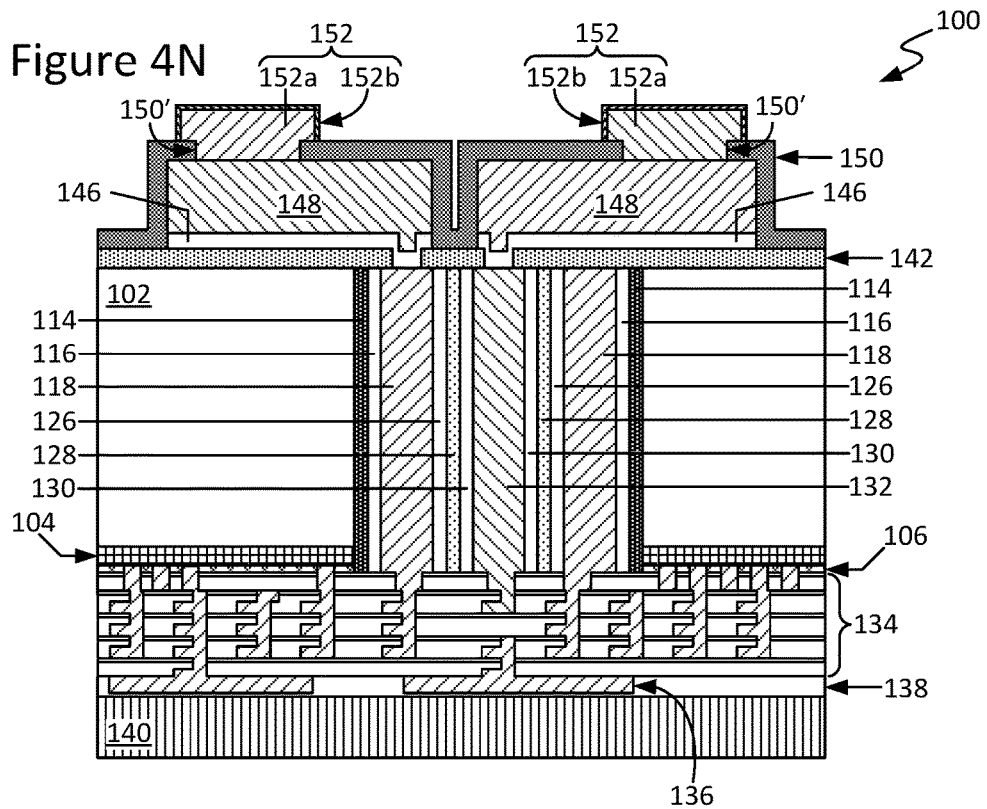
FIG. 4N is a cross-sectional view of the IC of FIG. 4M after removing any remaining patterned resist layer and forming a barrier/adhesion layer, one or more redistribution layers (RDLs), a dielectric layer, and a surface finish layer, in accordance with an embodiment of the present disclosure.
Figure 40:
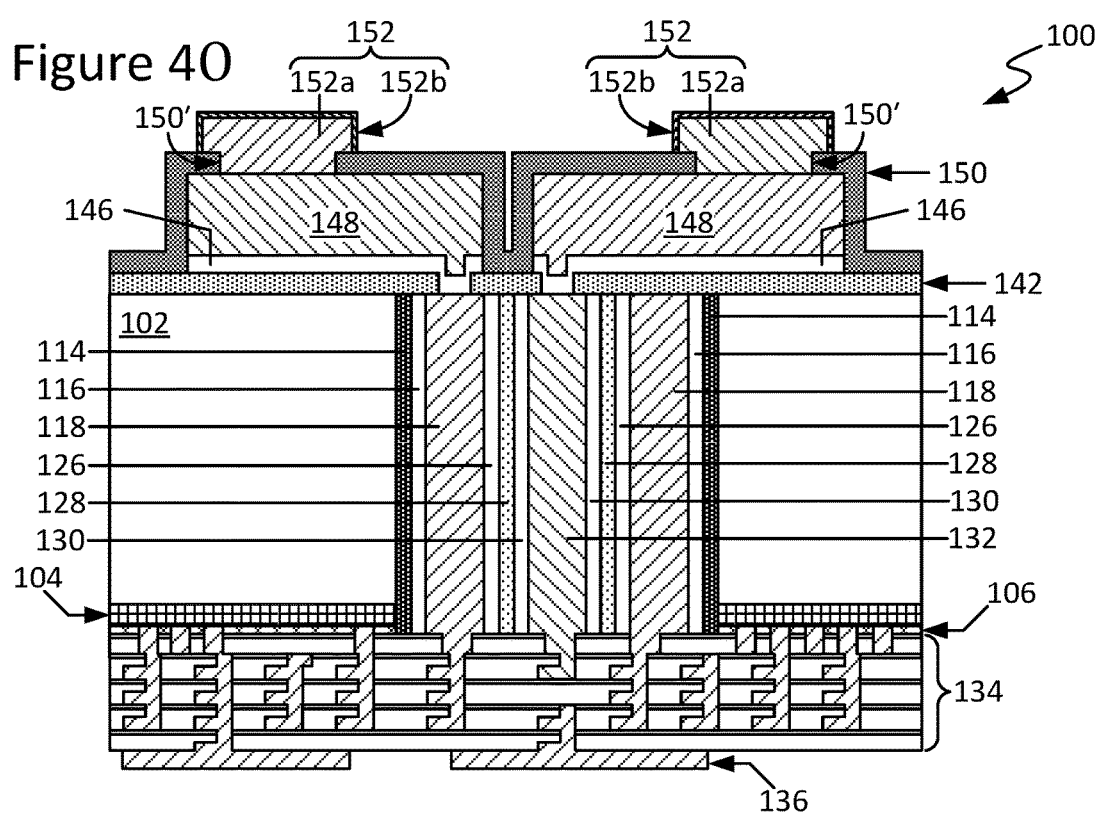

The process may continue as in FIG. 4N, which is a cross-sectional view of the IC 100 of FIG. 4M after removing any remaining patterned resist layer 144 and forming a barrier/adhesion layer 146, one or more redistribution layers (RDLs) 148, a dielectric layer 150, and a surface finish layer 152, in accordance with an embodiment of the present disclosure. As can be seen, any remaining resist layer 144 can be removed from IC 100. Also, in some cases, there may be one or more additional cleans, for example, to remove any remaining etch polymer and/or residue from the surface of IC 100. Other suitable techniques for removing the remainder, if any, of resist layer 144 will depend on a given application and will be apparent in light of this disclosure.

As can be seen, a barrier/adhesion layer 146 may be formed over the surface of IC 100 (e.g., over patterned dielectric layer 142). Barrier/adhesion layer 146 can be formed from any suitable barrier/adhesion material (or combination of such materials). For example, in some cases, barrier/adhesion layer 146 may be formed from: titanium (Ti); tantalum (Ta); titanium nitride (TiN); tantalum nitride (TaN); a titanium-tungsten (Ti—W) alloy; and/or a combination of any one or more thereof. Also, barrier/adhesion layer 146 can be formed over IC 100 using any suitable technique, and in accordance with some embodiments, may be formed using a physical vapor deposition (PVD) process. Other suitable materials and techniques for forming barrier/adhesion layer 146 will depend on a given application and will be apparent in light of this disclosure.

Furthermore, the dimensions of barrier/adhesion layer 146 can be customized as desired for a given target application or end-use. For example, in some embodiments, barrier/adhesion layer 146 may have a thickness in the range of about 250-1,000 Å (e.g., about 250-500 Å, about 500-750 Å, about 750-1,000 Å, or any other sub-range in the range of about 250-1,000 Å). In some instances, barrier/adhesion layer 146 may have a substantially uniform thickness over the topography provided, for example, by any underlying layers of IC 100 (e.g., patterned dielectric layer 142). In some instances, barrier/adhesion layer 146 may be provided as a substantially conformal layer over such topography. In some other instances, barrier/adhesion layer 146 may be provided with a non-uniform or otherwise varying thickness over such topography. For example, in some cases a first portion of barrier/adhesion layer 146 may have a thickness within a first range while a second portion thereof has a thickness within a second, different range. Other suitable dimensions for barrier/adhesion layer 146 will depend on a given application and will be apparent in light of this disclosure.

Also, as can be seen from FIG. 4N, one or more redistribution layers (RDLs) 148 may be formed over the surface of IC 100 (e.g., over barrier/adhesion layer 146). RDLs 148 can be formed from any suitable electrically conductive metal (or combination of such materials). For example, in some cases, RDLs 148 may be formed from: copper (Cu); aluminum (Al); and/or a combination of any one or more thereof. Also, RDLs 148 can be formed over IC 100 using any suitable technique, as typically done. For example, in accordance with some embodiments, RDLs 148 may be formed using a plate-through resist and/or semi-additive process flow. Other suitable materials and techniques for forming a given RDL 148 will depend on a given application and will be apparent in light of this disclosure.

Furthermore, the dimensions of a given RDL 148 can be customized as desired for a given target application or end-use. For example, in some embodiments, the one or more RDLs 148 may have a height in the range of about 1.0-10.0 μm (e.g., about 1.0-5.0 μm, about 5.0-10.0 μm, or any other sub-range in the range of about 1.0-10.0 μm). In some cases, a given RDL 148 may include a via (or other interconnect structure) extending therefrom which resides over a given opening 142' formed in dielectric layer 142. Other suitable dimensions for the one or more RDLs 148 will depend on a given application and will be apparent in light of this disclosure.

As can be seen further from FIG. 4N, a dielectric layer 150 may be formed over the surface of IC 100 (e.g., over the one or more RDLs 148 and/or dielectric layer 142). In accordance with some embodiments, dielectric layer 150 may serve, at least in part, as a passivation layer (e.g., a far-back-end passivation layer), which provides a hermetic barrier that protects the one or more underlying RDLs 148. To that end, dielectric layer 150 can be formed from any suitable dielectric material (or combination of such materials). For example, in some cases, dielectric layer 150 may be formed from: silicon nitride ($Si_3N_4$); silicon carbide (SiC); and/or a combination of any one or more thereof. In some cases, dielectric layer 150 may be configured to serve as dielectric layer for a logic/memory interface or for a bump structure that connects the backside of an active die to another (e.g., upper) die. Other suitable materials for dielectric layer 150 will depend on a given application and will be apparent in light of this disclosure.

Also, dielectric layer 150 can be formed over IC 100 using any of a wide variety of techniques. For example, in accordance with some embodiments, dielectric layer 150 may be formed using a chemical vapor deposition (CVD) process, such as plasma-enhanced CVD (PECVD). Other suitable techniques for forming dielectric layer 150 will depend on a given application and will be apparent in light of this disclosure.

Furthermore, the dimensions of dielectric layer 150 can be customized as desired for a given target application or end-use. For example, in some embodiments, dielectric layer 150 may have a thickness in the range of about 0.5-2.0 μm (e.g., about 0.5-1.25 μm, about 1.25-2.0 μm, or any other sub-range in the range of about 0.5-2.0 μm). In some instances, dielectric layer 150 may have a substantially uniform thickness over the topography provided, for example, by any underlying layers of IC 100 (e.g., RDLs 148 and/or dielectric layer 142). In some instances, dielectric layer 150 may be provided as a substantially conformal layer over such topography. In some other instances, dielectric layer 150 may be provided with a non-uniform or otherwise varying thickness over such topography. For example, in some cases a first portion of dielectric layer 150 may have a thickness within a first range while a second portion thereof has a thickness within a second, different range. Other suitable dimensions for dielectric layer 150 will depend on a given application and will be apparent in light of this disclosure.

In accordance with some embodiments, dielectric layer 150 may be patterned with one or more openings 150' (e.g., landing pad openings) therein. In accordance with some embodiments, a given opening 150' may be formed in dielectric layer 150 at a location over a RDL 148 associated with the outer conductor plate 118 of capacitor 101. Similarly, and in accordance with some embodiments, an opening 150' may be formed in dielectric layer 150 at a location over a RDL 148 associated with the inner conductor plate 132 of capacitor 101. The dimensions of a given opening 150' of dielectric layer 150 can be customized as desired for a given target application or end-use. A given opening 150' may be provided with a depth, for example, that traverses the entire thickness of dielectric layer 150, thus exposing the surface of an underlying RDL 148, in some cases. Other suitable dimensions for the one or more openings 150' will depend on a given application and will be apparent in light of this disclosure.

In addition, as can be seen from FIG. 4N, a surface finish layer 152 may be formed over the surface of IC 100 (e.g., within a given opening 150' over a RDL 148 and/or over a portion of dielectric layer 150). In accordance with some embodiments, surface finish layer 152 may be solder-compatible and may include: (1) a bump portion 152a; and (2) a capping film portion 152b. In accordance with some embodiments, a given bump portion 152a may reside, at least in part, within an opening 150' formed in dielectric layer 150 and may be in physical contact with an underlying RDL 148. A given bump portion 152a may have a capping film portion 152b formed over it, in accordance with some embodiments.

Surface finish layer 152 can be formed from any of a wide variety of suitable materials and using any suitable technique or combination of techniques. For instance, consider Table 1 below, which lists some example suitable materials and associated techniques for forming surface finish layer 152 (e.g., bump portion 152a and/or capping film portion 152b), in accordance with some embodiments:

TABLE 1

| A1. | Electroless deposition: Cobalt phosphide (CoP)/ |
| A2. | Immersion plating: Gold (Au) |
| B1. | Electroless deposition: Cobalt tungsten phosphide (CoWP)/ |
| B2. | Immersion plating: Gold (Au) |
| C1. | Electroless deposition: Nickel phosphide (NiP)/ |
| C2. | Immersion plating: Gold (Au) |
| D1. | Electroless deposition: Nickel phosphide (NiP)/ |
| D2. | Electroless deposition: Palladium (Pd)/ |
| D3. | Immersion plating: Gold (Au) |
| E1. | Electroless deposition: Tin (Sn) |

TABLE 1-continued

| F1. | Electroless deposition: Nickel phosphide (NiP)/ |
| F2. | Electroless deposition: Tin (Sn) |
| G1. | Electroless deposition: Cobalt tungsten phosphide (CoWP)/ |
| G2 | Electroless deposition: Tin (Sn) |
| H1. | Electroless deposition: Copper (Cu)/ |
| H2. | Electroless deposition: Cobalt phosphide (CoP)/ |
| H3. | Immersion plating: Gold (Au) |
| I1. | Electroless deposition: Copper (Cu)/ |
| I2. | Electroless deposition: Cobalt tungsten phosphide (CoWP)/ |
| I3. | Immersion plating: Gold (Au) |
| J1. | Electroless deposition: Copper (Cu)/ |
| J2. | Electroless deposition: Nickel phosphide (NiP)/ |
| J3. | Immersion plating: Gold (Au) |
| K1. | Electroless deposition: Copper (Cu)/ |
| K2. | Electroless deposition: Nickel phosphide (NiP)/ |
| K3. | Electroless deposition: Palladium (Pd)/ |
| K4. | Immersion plating: Gold (Au) |
| L1. | Electroless deposition: Copper (Cu)/ |
| L2. | Electroless deposition: Tin (Sn) |
| M1. | Electroless deposition: Copper (Cu)/ |
| M2. | Electroless deposition: Nickel phosphide (NiP)/ |
| M3. | Electroless deposition: Tin (Sn) |
| N1. | Electroless deposition: Copper (Cu)/ |
| N2. | Electroless deposition: Cobalt tungsten phosphide (CoWP)/ |
| N3. | Electroless deposition: Tin (Sn) |

It should be noted, however, that the present disclosure is not so limited to these example compositions and techniques for forming surface finish layer 152, as in a more general sense, surface finish layer 152 may be customized, for example, depending upon which chip-to-chip solder material(s) and/or chip-to-chip attachment methods are employed for a given target application or end-use. Other suitable materials and/or techniques for forming surface finish layer 152 will depend on a given application and will be apparent in light of this disclosure.

Furthermore, the dimensions of surface finish layer 152 can be customized as desired for a given target application or end-use. For example, in some embodiments, the bump portion 152a of surface finish layer 152 may have a thickness (e.g., height) in the range of about 2.0-4.0 μm (e.g., about 2.0-3.0 μm, about 3.0-4.0 μm, or any other sub-range in the range of about 2.0-4.0 μm). In some cases, neighboring bump portions 152a may be separated by a distance in the range of about 30-400 μm (e.g., about 30-120 μm, about 120-210 μm, about 210-300 μm, about 300-400 μm, or any other sub-range in the range of about 30-400 μm). In some embodiments, the capping film portion 152b of surface finish layer 152 may have a thickness, for example, in the range of about 50-200 nm (e.g., about 50-100 nm, about 100-150 nm, about 150-200 nm, or any other sub-range in the range of about 50-200 nm). In some instances, the capping film portion 152b of surface finish layer 152 may have a substantially uniform thickness over the topography provided, for example, by any underlying layers of IC 100 (e.g., bump layer 152a and/or dielectric layer 150). In some instances, the capping film portion 152b of surface finish layer 152 may be provided as a substantially conformal layer over such topography. In some other instances, the capping film portion 152b of surface finish layer 152 may be provided with a non-uniform or otherwise varying thickness over such topography. For example, in some cases a first portion of the capping film portion 152b of surface finish layer 152 may have a thickness within a first range while a second portion thereof has a thickness within a second, different range. Other suitable dimensions for surface finish layer 152 (bump portion 152a; capping film portion 152b) will depend on a given application and will be apparent in light of this disclosure.

It should be noted, however, that the present disclosure is not so limited only to providing IC 100 with a surface finish layer 152. For example, in accordance with some other embodiments, one or more flip-chip bumps (e.g., controlled collapse chip connections, or C4) optionally may be provided over IC 100 instead of a surface finish layer 152. When utilized, a given flip-chip bump can be formed from any suitable electrically conductive material (or combination of such materials). For example, in some cases, a given flip-chip bump may be formed from: tin (Sn); copper (Cu); indium (In); gold (Au); a lead-tin (Pb—Sn) alloy; a tin-silver (Sn—Ag) alloy; a tin-silver-copper (Sn—Ag—Cu) alloy; a tin-copper (Sn—Cu) alloy; and/or a combination of any one or more thereof. Also, as will be appreciated in light of this disclosure, a given flip-chip bump may be formed using any suitable technique (e.g., a screen-printing process and/or an electroplating process), as typically done. Furthermore, the dimensions of a given flip-chip bump can be customized, as desired for a given target application or end-use. Other suitable materials, configurations, and techniques for forming a given flip-chip bump will depend on a given application and will be apparent in light of this disclosure.

The process may continue as in FIG. 4O, which is a cross-sectional view of the IC 100 of FIG. 4N after de-bonding carrier substrate 140, in accordance with an embodiment of the present disclosure. Carrier substrate 140 can be de-bonded from IC 100 using any suitable processing technique, as typically done. As will be appreciated in light of this disclosure, selection of a given de-bonding technique may depend, at least in part, on the type of adhesive layer 138 utilized (e.g., solvent-release, laser-release, and/or thermal-release). After de-bonding carrier substrate 140, IC 100 may be available for downstream use and/or further processing, as desired. For example, in accordance with some embodiments, IC 100 may provide a structure upon which an additional layer and/or component can be populated.

The disclosed techniques can be used, in accordance with some embodiments, to provide a through-body-via (TBV) isolated coaxial capacitor 101 configured for any of a wide variety of electrical connections. For instance, in accordance with some embodiments, inner conductor plate 132 may be electronically connected with a RDL 148, and outer conductor plate 118 may be electronically connected with the same and/or a different RDL 148. In accordance with some other embodiments, inner conductor plate 132 may be electronically connected with a back-end layer 134, and outer conductor plate 118 may be electronically connected with the same and/or a different back-end layer 134. In some embodiments, inner conductor plate 132 may be electronically connected with a RDL 148, whereas outer conductor plate 118 may be electronically connected with a back-end layer 134. In some other embodiments, inner conductor plate 132 may be electronically connected with a back-end layer 134, whereas outer conductor plate 118 may be electronically connected with a RDL 148.

In some cases, inner conductor plate 132 may be electronically connected, for example, at two or more locations with a back-end layer 134. In some instances, inner conductor plate 132 may be electronically connected, for example, at two or more locations with a back-end layer 134. In some cases, outer conductor plate 118 may be electronically connected, for example, at two or more locations with a back-end layer 134. In some instances, inner conductor plate 132 may be electronically connected, for example, at two or more locations with a RDL 148. In some embodiments, inner conductor plate 132 may be electronically connected with a RDL 148 as well as a back-end layer 134.

In some embodiments, outer conductor plate 118 may be electronically connected with a RDL 148 as well as a back-end layer 134. Numerous configurations and combinations will be apparent in light of this disclosure.

In some instances, it may be desirable to electronically connect a plurality of TBV isolated coaxial capacitors 101 with one another, for example, to provide higher and/or lower capacitance values, as desired for a given target application or end-use. To that end, in some embodiments, two or more capacitors 101 may be connected in series. In some other embodiments, two or more capacitors 101 may be connected in parallel. With regard to parallel connections, in some such cases, each capacitor 101 in an array thereof may be connected by shorting their respective inner conductor plates 132 together (e.g., by RDL and/or active metal layer) and by shorting their respective outer conductor plates 118 together (e.g., by RDL and/or active metal layer). In further regard to parallel connections, in some such cases, each capacitor 101 in an array thereof may be connected by forming their respective outer conductor plates 118 so as to have a common/shared outer sidewall. That is, neighboring capacitors 101 may be formed sufficiently proximate one another such that the outer sidewalls of their respective outer conductor plates 118 are in physical contact with one another at one or more points. In some cases, such a configuration may help to conserve available die area. In some still other cases, a capacitor 101 may include a plurality (e.g., two, three, four, five, or more) of inner conductor plates 132 surrounded by a single outer conductor plate 118. Other suitable configurations and variations for a TBV isolated coaxial capacitor 101 will be apparent in light of this disclosure.

Example System

Figure 5:
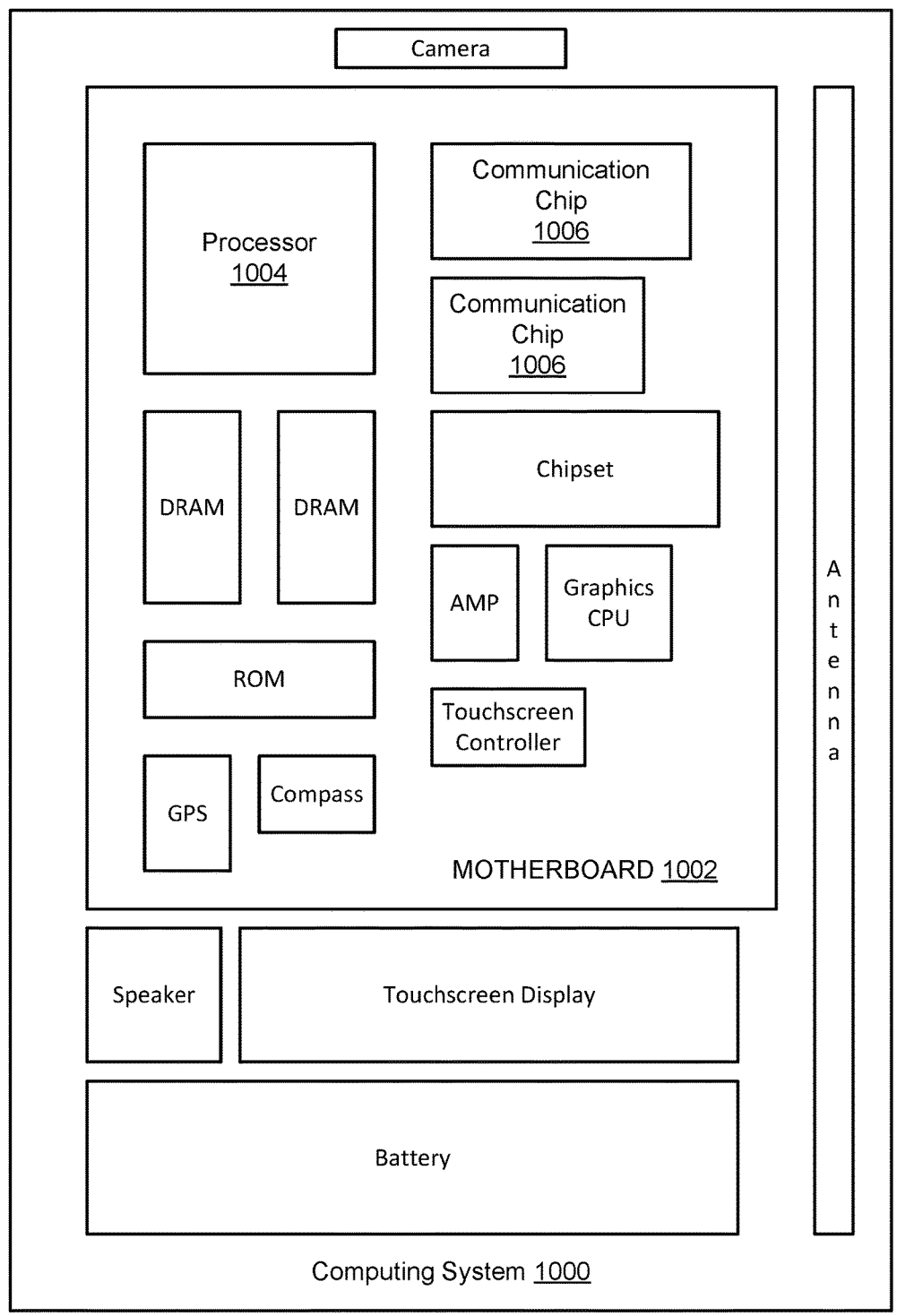
FIG. 5 illustrates a computing system implemented with integrated circuit structures or devices formed using the disclosed techniques in accordance with an example embodiment.

FIG. 5 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a semiconductor layer; and a capacitor formed within the semiconductor layer, the capacitor including: an electrically conductive through-body via (TBV); an electrically conductive plate surrounding the TBV and arranged coaxially therewith; and a dielectric layer disposed between the TBV and the plate.

Example 2 includes the subject matter of any of Examples 1 and 3-33, wherein the semiconductor layer comprises at least one of silicon (Si) and/or silicon germanium (SiGe).

Example 3 includes the subject matter of any of Examples 1-2 and 4-33, wherein the capacitor extends through the semiconductor layer from an upper surface thereof to a lower surface thereof.

Example 4 includes the subject matter of any of Examples 1-3 and 5-33, wherein the capacitor has a width/diameter in the range of about 6-30 μm.

Example 5 includes the subject matter of any of Examples 1-4 and 6-33, wherein the capacitor has a length in the range of about 50-100 μm.

Example 6 includes the subject matter of any of Examples 1-5 and 7-33, wherein the TBV comprises copper (Cu).

Example 7 includes the subject matter of any of Examples 1-6 and 8-33, wherein the TBV has a width/diameter in the range of about 2-10 μm.

Example 8 includes the subject matter of any of Examples 1-7 and 9-33, wherein the TBV has a length in the range of about 50-100 μm.

Example 9 includes the subject matter of any of Examples 1-8 and 10-33, wherein the plate comprises copper (Cu).

Example 10 includes the subject matter of any of Examples 1-9 and 11-33, wherein the plate has a length in the range of about 50-100 μm.

Example 11 includes the subject matter of any of Examples 1-10 and 12-33, wherein the dielectric layer has a thickness in the range of about 50-200 nm.

Example 12 includes the subject matter of any of Examples 1-11 and 13-33, wherein the dielectric layer comprises at least one of hafnium oxide ($HfO_2$), aluminum oxide ($Al_2O_3$), silicon dioxide ($SiO_2$), zirconium dioxide ($ZrO_2$), hafnium silicate ($HfSiO_4$), zirconium silicate ($ZrSiO_4$), and/or a combination of any one or more thereof.

Example 13 includes the subject matter of any of Examples 1-12 and 15-33, wherein the dielectric layer has a dielectric constant (κ-value) greater than or equal to about 3.9.

Example 14 includes the subject matter of any of Examples 1-12 and 15-33, wherein the dielectric layer has a dielectric constant (κ-value) less than about 3.9.

Example 15 includes the subject matter of any of Examples 1-14 and 16-33 and further includes an insulator layer disposed between the semiconductor layer and the plate of the capacitor.

Example 16 includes the subject matter of Example 15, wherein the insulator layer comprises at least one of silicon dioxide ($SiO_2$), polyimide, and/or a combination of any one or more thereof.

Example 17 includes the subject matter of Example 15, wherein the insulator layer has a thickness in the range of about 100-400 nm.

Example 18 includes the subject matter of any of Examples 1-17 and 19-33 and further includes a barrier layer disposed between the dielectric layer and the TBV.

Example 19 includes the subject matter of Example 18, wherein the barrier layer is configured as a bi-layer comprising at least one of titanium and copper (Ti/Cu) and/or tantalum and copper (Ta/Cu).

Example 20 includes the subject matter of any of Examples 1-19 and 21-33 and further includes a barrier layer disposed between the dielectric layer and the plate.

Example 21 includes the subject matter of Example 20, wherein the barrier layer comprises at least one of tantalum (Ta), titanium (Ti), titanium nitride (TiN), tantalum nitride (TaN), and/or a combination of any one or more thereof.

Example 22 includes the subject matter of any of Examples 1-21 and 23-33 and further includes a barrier layer disposed between the plate and the semiconductor layer.

Example 23 includes the subject matter of Example 22, wherein the barrier layer is configured as a bi-layer comprising at least one of titanium and copper (Ti/Cu) and/or tantalum and copper (Ta/Cu).

Example 24 includes the subject matter of any of Examples 1-23 and 25-33 and further includes a front-end transistor layer formed over a surface of the semiconductor layer.

Example 25 includes the subject matter of any of Examples 1-24 and 26-33 and further includes a metal redistribution layer (RDL) formed over a surface of the semiconductor layer, wherein the RDL is in electronic contact with at least one of the TBV and/or the plate.

Example 26 includes the subject matter of any of Examples 1-25 and 27-33 and further includes a back-end layer formed over a surface of the semiconductor layer, wherein the back-end layer is in electronic contact with at least one of the TBV and/or the plate.

Example 27 includes the subject matter of Example 26, wherein the back-end layer comprises at least one of a wiring layer, a passivation layer, and/or a metal redistribution layer (RDL).

Example 28 includes the subject matter of Example 26, wherein the back-end layer comprises a random-access memory device.

Example 29 includes the subject matter of Example 26 and further includes a surface finish layer formed over the back-end layer.

Example 30 includes the subject matter of Example 26 and further includes a metal bump layer formed over the back-end layer.

Example 31 includes the subject matter of Example 30, wherein the metal bump layer comprises at least one of a lead-tin (Pb—Sn) solder, a tin-silver (Sn—Ag) solder, a tin-copper (Sn—Cu) solder, gold (Au), and/or a combination of any one or more thereof.

Example 32 includes the subject matter of any of Examples 1-31 and further includes a carrier substrate bonded thereto.

Example 33 is a switched-capacitor voltage regulator (SCVR) including the subject matter of any of Examples 1-31.

Example 34 is a method of forming an integrated circuit, the method including: forming an electrically conductive plate within a semiconductor layer; forming a dielectric layer within an interior region bounded by the plate; and forming an electrically conductive through-body via (TBV) within an interior region bounded by the dielectric layer, wherein the TBV and plate are arranged coaxially, and wherein the dielectric layer electronically isolates the TBV and plate.

Example 35 includes the subject matter of any of Examples 34 and 36-45 and further includes forming an insulator layer between the semiconductor layer and the plate.

Example 36 includes the subject matter of any of Examples 34-35 and 37-45 and further includes forming a barrier layer between the semiconductor layer and the plate.

Example 37 includes the subject matter of any of Examples 34-36 and 38-45 and further includes forming a barrier layer between the plate and the dielectric layer.

Example 38 includes the subject matter of any of Examples 34-37 and 39-45 and further includes forming a barrier layer between the dielectric layer and the TBV.

Example 39 includes the subject matter of any of Examples 34-38 and 40-45 and further includes forming a front-end transistor layer over the semiconductor layer.

Example 40 includes the subject matter of any of Examples 34-39 and 41-45 and further includes forming a back-end layer over the semiconductor layer, plate, dielectric layer, and TBV, wherein the back-end layer is in electronic contact with at least one of the plate and/or TBV.

Example 41 includes the subject matter of Example 40 and further includes bonding a carrier substrate to the back-end layer.

Example 42 includes the subject matter of any of Examples 34-41 and 43-45 and further includes electronically connecting at least one of the plate and/or TBV with a redistribution layer (RDL).

Example 43 includes the subject matter of Example 42 and further includes forming a surface finish layer over the RDL.

Example 44 is an integrated circuit formed using the method including the subject matter of any of Examples 34-43 and 45.

Example 45 is a switched-capacitor voltage regulator (SCVR) including the subject matter of Example 44.

Example 46 is an integrated circuit including: a first semiconductor die having a first die surface including a first interconnect layer formed thereat; a second semiconductor die having a second die surface including a second interconnect layer formed thereat; and a cylindrical capacitor formed in the second semiconductor die, the cylindrical capacitor comprising: a copper through-body via (TBV); a copper plate surrounding the TBV and arranged coaxially therewith; and a dielectric layer disposed between the TBV and the plate; wherein the cylindrical capacitor electronically connects the first and second interconnect layers.

Example 47 includes the subject matter of any of Examples 46 and 48-51, wherein the cylindrical capacitor is electronically connected with at least one of a redistribution layer (RDL) and/or a back-end layer.

Example 48 includes the subject matter of any of Examples 46-47 and 49-51, wherein the dielectric layer comprises at least one of hafnium oxide ($HfO_2$), aluminum oxide ($Al_2O_3$), silicon dioxide ($SiO_2$), zirconium dioxide ($ZrO_2$), hafnium silicate ($HfSiO_4$), zirconium silicate ($ZrSiO_4$), and/or a combination of any one or more thereof.

Example 49 includes the subject matter of any of Examples 46-48 and 51, wherein the dielectric layer has a dielectric constant ($\kappa$-value) greater than or equal to about 3.9.

Example 50 includes the subject matter of any of Examples 46-48 and 51, wherein the dielectric layer has a dielectric constant ($\kappa$-value) less than about 3.9.

Example 51 includes the subject matter of any of Examples 46-50, wherein the cylindrical capacitor is electronically connected with a switched-capacitor voltage regulator (SCVR).

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. A method of forming an integrated circuit, the method comprising:
   forming an electrically conductive plate within a trench in a semiconductor layer, the trench surrounding a portion of the semiconductor layer, such that the plate surrounds the portion of the semiconductor layer after the plate is formed;
   removing the portion of the semiconductor layer to form an additional trench;
   forming a dielectric layer in the additional trench and within an interior region bounded by the plate; and
   forming an electrically conductive through-body via (TBV) in the additional trench and within an interior region bounded by the dielectric layer, wherein the TBV and plate are arranged coaxially, and wherein the dielectric layer electronically isolates the TBV and plate.

2. The method of claim 1 further comprising:
   forming a front-end transistor layer over the semiconductor layer.

3. The method of claim 1 further comprising at least one of:
   forming a back-end layer over the semiconductor layer, plate, dielectric layer, and TBV, wherein the back-end layer is in electronic contact with at least one of the plate and/or TBV; and
   bonding a carrier substrate to the back-end layer.

4. The method of claim 1, wherein the trench in the semiconductor layer is formed using a first etch into which the conductive plate is deposited, and a subsequent second etch completely removes the portion of the semiconductor layer that is surrounded by the plate the additional trench, the second etch being selective to the conductive plate, such that a location of the conductive TBV is self-aligned to a location of the conductive plate.

5. The method of claim 1 further comprising at least one of:
   electronically connecting at least one of the plate and/or TBV with a redistribution layer (RDL); and
   forming a surface finish layer over the RDL.

6. The method of claim 4, further comprising forming a barrier layer prior to forming the dielectric layer, such that the barrier layer is between the dielectric layer and the conductive plate, wherein the barrier layer includes at least one of tantalum, titanium, and/or nitrogen.

7. The method of claim 1, wherein forming the electrically conductive TBV includes an etch that is selective to the conductive plate, such that a location of the conductive TBV is self-aligned to a location of the conductive plate.

* * * * *